United States Patent [19]

Houk

[11] Patent Number: 5,050,120

[45] Date of Patent: Sep. 17, 1991

[54] RESIDUE ADDITION OVERFLOW DETECTION PROCESSOR

[75] Inventor: Theodore L. Houk, Seattle, Wash.

[73] Assignee: The Boeing Company, Seattle, Wash.

[21] Appl. No.: 414,276

[22] Filed: Sep. 29, 1989

[51] Int. Cl.⁵ .......................... G06E 1/04; G06F 7/38; H03M 7/02

[52] U.S. Cl. .................................. 364/746; 364/713; 364/745; 341/83

[58] Field of Search ..................... 364/713, 736.5, 745, 364/746; 341/83

[56] References Cited

U.S. PATENT DOCUMENTS

| | | | |
|---|---|---|---|
| 4,064,400 | 12/1977 | Akushsky et al. | 364/746 |
| 4,121,298 | 10/1978 | Akushsky et al. | 364/746 |
| 4,281,391 | 7/1981 | Huang | 381/83 |
| 4,567,355 | 1/1986 | Schuoecker et al. | 381/83 |
| 4,752,904 | 6/1988 | Paul | 381/83 |
| 4,797,843 | 1/1989 | Falk et al. | 364/713 |
| 4,910,699 | 3/1990 | Capps et al. | 364/746 |
| 4,948,959 | 8/1990 | Houk et al. | 364/746 |
| 4,949,294 | 8/1990 | Wamberque | 364/746 |
| 4,963,869 | 10/1990 | Falk | 364/746 |

OTHER PUBLICATIONS

N. S. Szabo, M.S. et al., "Residue Arithmetic and Its Applications to Computer Technology", McGraw-Hill Book Company, pp. 12–105.

F. J. Taylor, "Residue Arithmetic: A Tutorial with Examples", Computer, May 1984, pp. 50–62.

T. L. Houk et al., "Pipelined Number Conversions Using Optical Arithmetic/Logic Units", Paper 0215, TuA3, Oct. 13, 1987, Engineering Technology.

1987 Annual Meeting Optical Society of America Technical Digest, Summaries of Papers Presented at the Annual Meeting of the Optical Society of America, 18–23, Oct. 1987, Rochester, New York, Conference Edition.

Primary Examiner—Dale M. Shaw
Attorney, Agent, or Firm—Foley & Lardner

[57] ABSTRACT

A residue addition overflow detection processor detects overflow resulting from the addition of two residue numbers by extending the base of the two numbers, adding the two extended numbers to each other, and converting the resultant sum into mixed base representation. The digits of the mixed base representation are processed to produce signals indicating whether overflow has occurred. Delay circuits maintain the synchronism of the processing. The detection processor can be used in conjunction with optical information processing systems.

33 Claims, 17 Drawing Sheets

| DECIMAL NUMBER | RESIDUE NUMBER | | | MIXED BASE NUMBER | | |
|---|---|---|---|---|---|---|
| | $r_3$ ($M_3$=5) | $r_2$ ($M_2$=3) | $r_1$ ($M_1$=2) | $a_3$ ($W_3$=6) | $a_2$ ($W_2$=2) | $a_1$ ($W_1$=1) |
| 0 | 0 | 0 | 0 | 0 | 0 | 0 |
| 1 | 1 | 1 | 1 | 0 | 0 | 1 |
| 2 | 2 | 2 | 0 | 0 | 1 | 0 |
| 3 | 3 | 0 | 1 | 0 | 1 | 1 |
| 4 | 4 | 1 | 0 | 0 | 2 | 0 |
| 5 | 0 | 2 | 1 | 0 | 2 | 1 |
| 6 | 1 | 0 | 0 | 1 | 0 | 0 |
| 7 | 2 | 1 | 1 | 1 | 0 | 1 |
| 8 | 3 | 2 | 0 | 1 | 1 | 0 |
| 9 | 4 | 0 | 1 | 1 | 1 | 1 |
| 10 | 0 | 1 | 0 | 1 | 2 | 0 |
| 11 | 1 | 2 | 1 | 1 | 2 | 1 |
| 12 | 2 | 0 | 0 | 2 | 0 | 0 |
| 13 | 3 | 1 | 1 | 2 | 0 | 1 |
| 14 | 4 | 2 | 0 | 2 | 1 | 0 |
| 15 | 0 | 0 | 1 | 2 | 1 | 1 |
| 16 | 1 | 1 | 0 | 2 | 2 | 0 |
| 17 | 2 | 2 | 1 | 2 | 2 | 1 |
| 18 | 3 | 0 | 0 | 3 | 0 | 0 |
| 19 | 4 | 1 | 1 | 3 | 0 | 1 |
| 20 | 0 | 2 | 0 | 3 | 1 | 0 |
| 21 | 1 | 0 | 1 | 3 | 1 | 1 |
| 22 | 2 | 1 | 0 | 3 | 2 | 0 |
| 23 | 3 | 2 | 1 | 3 | 2 | 1 |
| 24 | 4 | 0 | 0 | 4 | 0 | 0 |
| 25 | 0 | 1 | 1 | 4 | 0 | 1 |
| 26 | 1 | 2 | 0 | 4 | 1 | 0 |
| 27 | 2 | 0 | 1 | 4 | 1 | 1 |
| 28 | 3 | 1 | 0 | 4 | 2 | 0 |
| 29 | 4 | 2 | 1 | 4 | 2 | 1 |

FIG.1

```
     3       0       0     DECIMAL NUMBER 18
+    4       1       1     DECIMAL NUMBER 19
   ─────────────────────
   7 mod 5  1 mod 3  1 mod 2
     2       1       1
```

| DECIMAL NUMBER | RESIDUE NUMBER | | | MIXED BASE NUMBER | | |
|---|---|---|---|---|---|---|
| | $r_3$ ($M_3=5$) | $r_2$ ($M_2=3$) | $r_1$ ($M_1=2$) | $a_3$ ($W_3=6$) | $a_2$ ($W_2=2$) | $a_1$ ($W_1=1$) |
| 0 | 0 | 0 | 0 | 0 | 0 | 0 |
| 1 | 1 | 1 | 1 | 0 | 0 | 1 |
| 2 | 2 | 2 | 0 | 0 | 1 | 0 |
| 3 | 3 | 0 | 1 | 0 | 1 | 1 |
| 4 | 4 | 1 | 0 | 0 | 2 | 0 |
| 5 | 0 | 2 | 1 | 0 | 2 | 1 |
| 6 | 1 | 0 | 0 | 1 | 0 | 0 |
| 7 | 2 | 1 | 1 | 1 | 0 | 1 |
| 8 | 3 | 2 | 0 | 1 | 1 | 0 |
| 9 | 4 | 0 | 1 | 1 | 1 | 1 |
| 10 | 0 | 1 | 0 | 1 | 2 | 0 |
| 11 | 1 | 2 | 1 | 1 | 2 | 1 |
| 12 | 2 | 0 | 0 | 2 | 0 | 0 |
| 13 | 3 | 1 | 1 | 2 | 0 | 1 |
| 14 | 4 | 2 | 0 | 2 | 1 | 0 |
| -15 | 0 | 0 | 1 | 2 | 1 | 1 |
| -14 | 1 | 1 | 0 | 2 | 2 | 0 |
| -13 | 2 | 2 | 1 | 2 | 2 | 1 |
| -12 | 3 | 0 | 0 | 3 | 0 | 0 |
| -11 | 4 | 1 | 1 | 3 | 0 | 1 |
| -10 | 0 | 2 | 0 | 3 | 1 | 0 |
| -9 | 1 | 0 | 1 | 3 | 1 | 1 |
| -8 | 2 | 1 | 0 | 3 | 2 | 0 |
| -7 | 3 | 2 | 1 | 3 | 2 | 1 |
| -6 | 4 | 0 | 0 | 4 | 0 | 0 |
| -5 | 0 | 1 | 1 | 4 | 0 | 1 |
| -4 | 1 | 2 | 0 | 4 | 1 | 0 |
| -3 | 2 | 0 | 1 | 4 | 1 | 1 |
| -2 | 3 | 1 | 0 | 4 | 2 | 0 |
| -1 | 4 | 2 | 1 | 4 | 2 | 1 |

FIG. 4

| DECIMAL NUMBER | RESIDUE NUMBER | | | MIXED BASE NUMBER | | |
|---|---|---|---|---|---|---|
| | $r_3$ ($M_3=2$) | $r_2$ ($M_2=5$) | $r_1$ ($M_1=3$) | $a_3$ ($W_3=15$) | $a_2$ ($W_2=3$) | $a_1$ ($W_1=1$) |
| 0 | 0 | 0 | 0 | 0 | 0 | 0 |
| 1 | 1 | 1 | 1 | 0 | 0 | 1 |
| 2 | 0 | 2 | 2 | 0 | 0 | 0 |
| 3 | 1 | 3 | 0 | 0 | 1 | 0 |
| 4 | 0 | 4 | 1 | 0 | 1 | 0 |
| 5 | 1 | 0 | 2 | 0 | 1 | 0 |
| 6 | 0 | 1 | 0 | 0 | 2 | 0 |
| 7 | 1 | 2 | 1 | 0 | 2 | 1 |
| 8 | 0 | 3 | 2 | 0 | 2 | 0 |
| 9 | 1 | 4 | 0 | 0 | 3 | 1 |
| 10 | 0 | 0 | 1 | 0 | 3 | 0 |
| 11 | 1 | 1 | 2 | 0 | 3 | 1 |
| 12 | 0 | 2 | 0 | 0 | 4 | 0 |
| 13 | 1 | 3 | 1 | 0 | 4 | 1 |
| 14 | 0 | 4 | 2 | 0 | 4 | 0 |
| -15 | 1 | 0 | 0 | 1 | 0 | 1 |
| -14 | 0 | 1 | 1 | 1 | 0 | 0 |
| -13 | 1 | 2 | 2 | 1 | 0 | 1 |
| -12 | 0 | 3 | 0 | 1 | 1 | 0 |
| -11 | 1 | 4 | 1 | 1 | 1 | 1 |
| -10 | 0 | 0 | 2 | 1 | 1 | 0 |
| -9 | 1 | 1 | 0 | 1 | 2 | 1 |
| -8 | 0 | 2 | 1 | 1 | 2 | 0 |
| -7 | 1 | 3 | 2 | 1 | 2 | 1 |
| -6 | 0 | 4 | 0 | 1 | 3 | 0 |
| -5 | 1 | 0 | 1 | 1 | 3 | 1 |
| -4 | 0 | 1 | 2 | 1 | 3 | 0 |
| -3 | 1 | 2 | 0 | 1 | 4 | 1 |
| -2 | 0 | 3 | 1 | 1 | 4 | 0 |
| -1 | 1 | 4 | 2 | 1 | 4 | 1 |

FIG. 6

| DECIMAL NUMBER | RESIDUE NUMBER | | | | MIXED BASE NUMBER | | | |
|---|---|---|---|---|---|---|---|---|
| | $r_r$ | $r_3$ | $r_2$ | $r_1$ | $a_r$ | $a_3$ | $a_2$ | $a_1$ |
| | $(M_r=1)$ | $(M_3=5)$ | $(M_2=3)$ | $(M_1=2)$ | | | | |
| 0 | 0 | 0 | 0 | 0 | 0 | 0 | 0 | 0 |
| 1 | 0 | 1 | 1 | 1 | 0 | 0 | 0 | 1 |
| 2 | 0 | 2 | 2 | 0 | 0 | 0 | 1 | 0 |
| 3 | 0 | 3 | 0 | 1 | 0 | 0 | 1 | 1 |
| 4 | 0 | 4 | 1 | 0 | 0 | 0 | 2 | 0 |
| 5 | 0 | 0 | 2 | 1 | 0 | 0 | 2 | 1 |
| 6 | 0 | 1 | 0 | 0 | 0 | 1 | 0 | 0 |
| 7 | 0 | 2 | 1 | 1 | 0 | 1 | 0 | 1 |
| 8 | 0 | 3 | 2 | 0 | 0 | 1 | 1 | 0 |
| 9 | 0 | 4 | 0 | 1 | 0 | 1 | 1 | 1 |
| 10 | 0 | 0 | 1 | 0 | 0 | 1 | 2 | 0 |
| 11 | 0 | 1 | 2 | 1 | 0 | 1 | 2 | 1 |
| 12 | 0 | 2 | 0 | 0 | 0 | 2 | 0 | 0 |
| 13 | 0 | 3 | 1 | 1 | 0 | 2 | 0 | 1 |
| 14 | 0 | 4 | 2 | 0 | 0 | 2 | 1 | 0 |
| 15 | 0 | 0 | 0 | 1 | 0 | 2 | 1 | 1 |
| 16 | 0 | 1 | 1 | 0 | 0 | 2 | 2 | 0 |
| 17 | 0 | 2 | 2 | 1 | 0 | 2 | 2 | 1 |
| 18 | 0 | 3 | 0 | 0 | 0 | 3 | 0 | 0 |
| 19 | 0 | 4 | 1 | 1 | 0 | 3 | 0 | 1 |
| 20 | 0 | 0 | 2 | 0 | 0 | 3 | 1 | 0 |
| 21 | 0 | 1 | 0 | 1 | 0 | 3 | 1 | 1 |
| 22 | 0 | 2 | 1 | 0 | 0 | 3 | 2 | 0 |
| 23 | 0 | 3 | 2 | 1 | 0 | 3 | 2 | 1 |
| 24 | 0 | 4 | 0 | 0 | 0 | 4 | 0 | 0 |
| 25 | 0 | 0 | 1 | 1 | 0 | 4 | 0 | 1 |
| 26 | 0 | 1 | 2 | 0 | 0 | 4 | 1 | 0 |
| 27 | 0 | 2 | 0 | 1 | 0 | 4 | 1 | 1 |
| 28 | 0 | 3 | 1 | 0 | 0 | 4 | 2 | 0 |
| 29 | 0 | 4 | 2 | 1 | 0 | 4 | 2 | 1 |
| 30 | 0 | 0 | 0 | 0 | 1 | 0 | 0 | 0 |
| 31 | 0 | 1 | 1 | 1 | 1 | 0 | 0 | 1 |
| 32 | 0 | 2 | 2 | 0 | 1 | 0 | 1 | 0 |
| 33 | 0 | 3 | 0 | 1 | 1 | 0 | 1 | 1 |
| 34 | 0 | 4 | 1 | 0 | 1 | 0 | 2 | 0 |
| 35 | 0 | 0 | 2 | 1 | 1 | 0 | 2 | 1 |
| 36 | 0 | 1 | 0 | 0 | 1 | 1 | 0 | 0 |
| 37 | 0 | 2 | 1 | 1 | 1 | 1 | 0 | 1 |
| 38 | 0 | 3 | 2 | 0 | 1 | 1 | 1 | 0 |
| 39 | 0 | 4 | 0 | 1 | 1 | 1 | 1 | 1 |
| 40 | 0 | 5 | 0 | 0 | | | 2 | 0 |

| DECIMAL NUMBER | RING POSITION | RESIDUE NUMBER | | | | MIXED BASE NUMBER | | | |
|---|---|---|---|---|---|---|---|---|---|
| | | $r_r$ | $r_3$ | $r_2$ | $r_1$ | $a_r$ | $a_3$ | $a_2$ | $a_1$ |
| | | $(M_r=7)$ | $(M_3=2)$ | $(M_2=5)$ | $(M_1=3)$ | | | | |
| -20 | 190 | 1 | 0 | 0 | 1 | 6 | 0 | 3 | 1 |
| -19 | 191 | 2 | 1 | 1 | 2 | 6 | 0 | 3 | 2 |
| -18 | 192 | 3 | 0 | 2 | 0 | 6 | 0 | 4 | 0 |
| -17 | 193 | 4 | 1 | 3 | 1 | 6 | 0 | 4 | 1 |
| -16 | 194 | 5 | 0 | 4 | 2 | 6 | 0 | 4 | 2 |
| -15 | 195 | 6 | 1 | 0 | 0 | 6 | 1 | 0 | 0 |
| -14 | 196 | 0 | 0 | 1 | 1 | 6 | 1 | 0 | 1 |
| -13 | 197 | 1 | 1 | 2 | 2 | 6 | 1 | 0 | 2 |
| -12 | 198 | 2 | 0 | 3 | 0 | 6 | 1 | 1 | 0 |
| -11 | 199 | 3 | 1 | 4 | 1 | 6 | 1 | 1 | 1 |
| -10 | 200 | 4 | 0 | 0 | 2 | 6 | 1 | 1 | 2 |
| -9 | 201 | 5 | 1 | 1 | 0 | 6 | 1 | 2 | 0 |
| -8 | 202 | 6 | 0 | 2 | 1 | 6 | 1 | 2 | 1 |
| -7 | 203 | 0 | 1 | 3 | 2 | 6 | 1 | 2 | 2 |
| -6 | 204 | 1 | 0 | 4 | 0 | 6 | 1 | 3 | 0 |
| -5 | 205 | 2 | 1 | 0 | 1 | 6 | 1 | 3 | 1 |
| -4 | 206 | 3 | 0 | 1 | 2 | 6 | 1 | 3 | 2 |
| -3 | 207 | 4 | 1 | 2 | 0 | 6 | 1 | 4 | 0 |
| -2 | 208 | 5 | 0 | 3 | 1 | 6 | 1 | 4 | 1 |
| -1 | 209 | 6 | 1 | 4 | 2 | 6 | 1 | 4 | 2 |
| 0 | 0 | 0 | 0 | 0 | 0 | 0 | 0 | 0 | 0 |
| 1 | 1 | 1 | 1 | 1 | 1 | 0 | 0 | 0 | 1 |
| 2 | 2 | 2 | 0 | 2 | 2 | 0 | 0 | 0 | 2 |
| 3 | 3 | 3 | 1 | 3 | 0 | 0 | 0 | 1 | 0 |
| 4 | 4 | 4 | 0 | 4 | 1 | 0 | 0 | 1 | 1 |
| 5 | 5 | 5 | 1 | 0 | 2 | 0 | 0 | 1 | 2 |
| 6 | 6 | 6 | 0 | 1 | 0 | 0 | 0 | 2 | 0 |
| 7 | 7 | 0 | 1 | 2 | 1 | 0 | 0 | 2 | 1 |
| 8 | 8 | 1 | 0 | 3 | 2 | 0 | 0 | 2 | 2 |
| 9 | 9 | 2 | 1 | 4 | 0 | 0 | 0 | 3 | 0 |
| 10 | 10 | 3 | 0 | 0 | 1 | 0 | 0 | 3 | 1 |
| 11 | 11 | 4 | 1 | 1 | 2 | 0 | 0 | 3 | 2 |
| 12 | 12 | 5 | 0 | 2 | 0 | 0 | 0 | 4 | 0 |
| 13 | 13 | 6 | 1 | 3 | 1 | 0 | 0 | 4 | 1 |
| 14 | 14 | 0 | 0 | 4 | 2 | 0 | 0 | 4 | 2 |
| 15 | 15 | 1 | 1 | 0 | 0 | 0 | 1 | 0 | 0 |
| 16 | 16 | 2 | 0 | 1 | 1 | 0 | 1 | 0 | 1 |
| 17 | 17 | 3 | 1 | 2 | 2 | 0 | 1 | 0 | 2 |
| 18 | 18 | 4 | 0 | 3 | 0 | 0 | 1 | 1 | 0 |
| 19 | 19 | 5 | 1 | 4 | 1 | 0 | 1 | 1 | 1 |
| 20 | 20 | 6 | 0 | 0 | 2 | 0 | 1 | 1 | 2 |

FIG.8

| DECIMAL NUMBER | RING POSITION | RESIDUE NUMBER | | | MIXED BASE NUMBER | | |
|---|---|---|---|---|---|---|---|
| | | $r_3$ ($M_3=7$) | $r_2$ ($M_2=5$) | $r_1$ ($M_1=3$) | $a_3$ | $a_2$ | $a_1$ |
| -20 | 85 | 1 | 0 | 1 | 5 | 3 | 1 |
| -19 | 86 | 2 | 1 | 2 | 5 | 3 | 2 |
| -18 | 87 | 3 | 2 | 0 | 5 | 4 | 0 |
| -17 | 88 | 4 | 3 | 1 | 5 | 4 | 1 |
| -16 | 89 | 5 | 4 | 2 | 5 | 4 | 2 |
| -15 | 90 | 6 | 0 | 0 | 6 | 0 | 0 |
| -14 | 91 | 0 | 1 | 1 | 6 | 0 | 1 |
| -13 | 92 | 1 | 2 | 2 | 6 | 0 | 2 |
| -12 | 93 | 2 | 3 | 0 | 6 | 1 | 0 |
| -11 | 94 | 3 | 4 | 1 | 6 | 1 | 1 |
| -10 | 95 | 4 | 0 | 2 | 6 | 1 | 2 |
| -9 | 96 | 5 | 1 | 0 | 6 | 2 | 0 |
| -8 | 97 | 6 | 2 | 1 | 6 | 2 | 1 |
| -7 | 98 | 0 | 3 | 2 | 6 | 2 | 2 |
| -6 | 99 | 1 | 4 | 0 | 6 | 3 | 0 |
| -5 | 100 | 2 | 0 | 1 | 6 | 3 | 1 |
| -4 | 101 | 3 | 1 | 2 | 6 | 3 | 2 |
| -3 | 102 | 4 | 2 | 0 | 6 | 4 | 0 |
| -2 | 103 | 5 | 3 | 1 | 6 | 4 | 1 |
| -1 | 104 | 6 | 4 | 2 | 6 | 4 | 2 |
| 0 | 0 | 0 | 0 | 0 | 0 | 0 | 0 |
| 1 | 1 | 1 | 1 | 1 | 0 | 0 | 1 |
| 2 | 2 | 2 | 2 | 2 | 0 | 0 | 2 |
| 3 | 3 | 3 | 3 | 0 | 0 | 1 | 0 |
| 4 | 4 | 4 | 4 | 1 | 0 | 1 | 1 |
| 5 | 5 | 5 | 0 | 2 | 0 | 1 | 2 |
| 6 | 6 | 6 | 1 | 0 | 0 | 2 | 0 |
| 7 | 7 | 0 | 2 | 1 | 0 | 2 | 1 |
| 8 | 8 | 1 | 3 | 2 | 0 | 2 | 2 |
| 9 | 9 | 2 | 4 | 0 | 0 | 3 | 0 |
| 10 | 10 | 3 | 0 | 1 | 0 | 3 | 1 |
| 11 | 11 | 4 | 1 | 2 | 0 | 3 | 2 |
| 12 | 12 | 5 | 2 | 0 | 0 | 4 | 0 |
| 13 | 13 | 6 | 3 | 1 | 0 | 4 | 1 |
| 14 | 14 | 0 | 4 | 2 | 0 | 4 | 2 |
| 15 | 15 | 1 | 0 | 0 | 1 | 0 | 0 |
| 16 | 16 | 2 | 1 | 1 | 1 | 0 | 1 |
| 17 | 17 | 3 | 2 | 2 | 1 | 0 | 2 |
| 18 | 18 | 4 | 3 | 0 | 1 | 1 | 0 |
| 19 | 19 | 5 | 4 | 1 | 1 | 1 | 1 |
| 20 | 20 | 6 | 0 | 2 | 1 | 1 | 2 |

FIG. 9

| DECIMAL NUMBER | RING POSITION | RESIDUE NUMBER | | | MIXED BASE NUMBER | | |
|---|---|---|---|---|---|---|---|
| | | $r_3$ $(M_3=3)$ | $r_2$ $(M_2=5)$ | $r_1$ $(M_1=7)$ | $a_3$ | $a_2$ | $a_1$ |
| -52 | 53 | 2 | 3 | 4 | 1 | 2 | 4 |
| -51 | 54 | 0 | 4 | 5 | 1 | 2 | 5 |
| -50 | 55 | 1 | 0 | 6 | 1 | 3 | 6 |
| -49 | 56 | 2 | 1 | 0 | 1 | 3 | 0 |
| -48 | 57 | 0 | 2 | 1 | 1 | 3 | 1 |
| -47 | 58 | 1 | 3 | 2 | 1 | 3 | 2 |
| -46 | 59 | 2 | 4 | 3 | 1 | 3 | 3 |
| -45 | 60 | 0 | 0 | 4 | 1 | 3 | 4 |
| -44 | 61 | 1 | 1 | 5 | 1 | 3 | 5 |
| -43 | 62 | 2 | 2 | 6 | 1 | 3 | 6 |
| -42 | 63 | 0 | 3 | 0 | 1 | 4 | 0 |
| -41 | 64 | 1 | 4 | 1 | 1 | 4 | 1 |
| -40 | 65 | 2 | 0 | 2 | 1 | 4 | 2 |
| -39 | 66 | 0 | 1 | 3 | 1 | 4 | 3 |
| -38 | 67 | 1 | 2 | 4 | 1 | 4 | 4 |
| -37 | 68 | 2 | 3 | 5 | 1 | 4 | 5 |
| -36 | 69 | 0 | 4 | 6 | 1 | 4 | 6 |
| -35 | 70 | 1 | 0 | 0 | 2 | 0 | 0 |
| -34 | 71 | 2 | 1 | 1 | 2 | 0 | 1 |
| -33 | 72 | 0 | 2 | 2 | 2 | 0 | 2 |
| -32 | 73 | 1 | 3 | 3 | 2 | 0 | 3 |
| -31 | 74 | 2 | 4 | 4 | 2 | 0 | 4 |
| -30 | 75 | 0 | 0 | 5 | 2 | 0 | 5 |
| -29 | 76 | 1 | 1 | 6 | 2 | 0 | 6 |
| -28 | 77 | 2 | 2 | 0 | 2 | 1 | 0 |
| -27 | 78 | 0 | 3 | 1 | 2 | 1 | 1 |
| -26 | 79 | 1 | 4 | 2 | 2 | 1 | 2 |
| -25 | 80 | 2 | 0 | 3 | 2 | 1 | 3 |
| -24 | 81 | 0 | 1 | 4 | 2 | 1 | 4 |
| -23 | 82 | 1 | 2 | 5 | 2 | 1 | 5 |
| -22 | 83 | 2 | 3 | 6 | 2 | 1 | 6 |
| -21 | 84 | 0 | 4 | 0 | 2 | 2 | 0 |
| -20 | 85 | 1 | 0 | 1 | 2 | 2 | 1 |
| -19 | 86 | 2 | 1 | 2 | 2 | 2 | 2 |
| -18 | 87 | 0 | 2 | 3 | 2 | 2 | 3 |
| -17 | 88 | 1 | 3 | 4 | 2 | 2 | 4 |
| -16 | 89 | 2 | 4 | 5 | 2 | 2 | 5 |
| -15 | 90 | 0 | 0 | 6 | 2 | 2 | 6 |
| -14 | 91 | 1 | 1 | 0 | 2 | 3 | 0 |
| -13 | 92 | 2 | 2 | 1 | 2 | 3 | 1 |
| -12 | 93 | 0 | 3 | 2 | 2 | 3 | 2 |
| -11 | 94 | 1 | 4 | 3 | 2 | 3 | 3 |
| -10 | 95 | 2 | 0 | 4 | 2 | 3 | 4 |
| -9 | 96 | 0 | 1 | 5 | 2 | 3 | 5 |
| -8 | 97 | 1 | 2 | 6 | 2 | 3 | 6 |
| -7 | 98 | 2 | 3 | 0 | 2 | 4 | 0 |
| -6 | 99 | 0 | 4 | 1 | 2 | 4 | 1 |
| -5 | 100 | 1 | 0 | 2 | 2 | 4 | 2 |
| -4 | 101 | 2 | 1 | 3 | 2 | 4 | 3 |
| -3 | 102 | 0 | 2 | 4 | 2 | 4 | 4 |
| -2 | 103 | 1 | 3 | 5 | 2 | 4 | 5 |
| -1 | 104 | 2 | 4 | 6 | 2 | 4 | 6 |
| 0 | 0 | 0 | 0 | 0 | 0 | 0 | 0 |
| 1 | 1 | 1 | 1 | 1 | 0 | 0 | 1 |
| 2 | 2 | 2 | 2 | 2 | 0 | 0 | 2 |
| 3 | 3 | 0 | 3 | 3 | 0 | 0 | 3 |
| 4 | 4 | 1 | 4 | 4 | 0 | 0 | 4 |

FIG. 10

| DECIMAL NUMBER | RING POSITION | RESIDUE NUMBER | | | MIXED BASE NUMBER | | |
|---|---|---|---|---|---|---|---|
| | | $r_3$ ($M_3$=3) | $r_2$ ($M_2$=5) | $r_1$ ($M_1$=7) | $a_3$ | $a_2$ | $a_1$ |
| 5 | 5 | 2 | 0 | 5 | 0 | 0 | 5 |
| 6 | 6 | 0 | 1 | 6 | 0 | 0 | 6 |
| 7 | 7 | 1 | 2 | 0 | 0 | 1 | 0 |
| 8 | 8 | 2 | 3 | 1 | 0 | 1 | 1 |
| 9 | 9 | 0 | 4 | 2 | 0 | 1 | 2 |
| 10 | 10 | 1 | 0 | 3 | 0 | 1 | 3 |
| 11 | 11 | 2 | 1 | 4 | 0 | 1 | 4 |
| 12 | 12 | 0 | 2 | 5 | 0 | 1 | 5 |
| 13 | 13 | 1 | 3 | 6 | 0 | 1 | 6 |
| 14 | 14 | 2 | 4 | 0 | 0 | 2 | 0 |
| 15 | 15 | 0 | 0 | 1 | 0 | 2 | 1 |
| 16 | 16 | 1 | 1 | 2 | 0 | 2 | 2 |
| 17 | 17 | 2 | 2 | 3 | 0 | 2 | 3 |
| 18 | 18 | 0 | 3 | 4 | 0 | 2 | 4 |
| 19 | 19 | 1 | 4 | 5 | 0 | 2 | 5 |
| 20 | 20 | 2 | 0 | 6 | 0 | 2 | 6 |
| 21 | 21 | 0 | 1 | 0 | 0 | 3 | 0 |
| 22 | 22 | 1 | 2 | 1 | 0 | 3 | 1 |
| 23 | 23 | 2 | 3 | 2 | 0 | 3 | 2 |
| 24 | 24 | 0 | 4 | 3 | 0 | 3 | 3 |
| 25 | 25 | 1 | 0 | 4 | 0 | 3 | 4 |
| 26 | 26 | 2 | 1 | 5 | 0 | 3 | 5 |
| 27 | 27 | 0 | 2 | 6 | 0 | 3 | 6 |
| 28 | 28 | 1 | 3 | 0 | 0 | 4 | 0 |
| 29 | 29 | 2 | 4 | 1 | 0 | 4 | 1 |
| 30 | 30 | 0 | 0 | 2 | 0 | 4 | 2 |
| 31 | 31 | 1 | 1 | 3 | 0 | 4 | 3 |
| 32 | 32 | 2 | 2 | 4 | 0 | 4 | 4 |
| 33 | 33 | 0 | 3 | 5 | 0 | 4 | 5 |
| 34 | 34 | 1 | 4 | 6 | 0 | 4 | 6 |
| 35 | 35 | 2 | 0 | 0 | 1 | 0 | 0 |
| 36 | 36 | 0 | 1 | 1 | 1 | 0 | 1 |
| 37 | 37 | 1 | 2 | 2 | 1 | 0 | 2 |
| 38 | 38 | 2 | 3 | 3 | 1 | 0 | 3 |
| 39 | 39 | 0 | 4 | 4 | 1 | 0 | 4 |
| 40 | 40 | 1 | 0 | 5 | 1 | 0 | 5 |
| 41 | 41 | 2 | 1 | 6 | 1 | 0 | 6 |
| 42 | 42 | 0 | 2 | 0 | 1 | 1 | 0 |
| 43 | 43 | 1 | 3 | 1 | 1 | 1 | 1 |
| 44 | 44 | 2 | 4 | 2 | 1 | 1 | 2 |
| 45 | 45 | 0 | 0 | 3 | 1 | 1 | 3 |
| 46 | 46 | 1 | 1 | 4 | 1 | 1 | 4 |
| 47 | 47 | 2 | 2 | 5 | 1 | 1 | 5 |
| 48 | 48 | 0 | 3 | 6 | 1 | 1 | 6 |
| 49 | 49 | 1 | 4 | 0 | 1 | 2 | 0 |
| 50 | 50 | 2 | 0 | 1 | 1 | 2 | 1 |
| 51 | 51 | 0 | 1 | 2 | 1 | 2 | 2 |
| 52 | 52 | 1 | 2 | 3 | 1 | 2 | 3 |

FIG. 10 cont.

RESIDUE ADDITION OVERFLOW DETECTION PROCESSOR

BACKGROUND OF THE INVENTION

The invention is in the field of information processing. Specifically, the invention relates to the detection of overflow in residue number system (RNS) addition operations.

The RNS has received considerable attention in recent times as an effective tool for performing single step, parallel computation of sums, differences, and products. A system employing the RNS may be used for high speed, real time, parallel processing of data.

A difficulty associated with actually achieving fast computation with the RNS is that an RNS representation of a number does not provide explicit sign and magnitude information. The lack of explicit sign and magnitude information hinders overflow detection. *Residue Arithmetic and Its Application to Computer Technology*, N. S. Szabo and R. I. Tanaka, (McGraw Hill, New York, 1967) and "Residue Arithmetic: A Tutorial with Examples," F. J. Taylor *Computer* Vol. 17, No. 5, pp. 50-62 (May 1984), both incorporated by reference, provide general background information on the RNS and the mixed base number system, to be discussed below.

Optical information processors which are ideally suited to perform the parallel computations required in RNS arithmetic are currently under development. There are fundamental differences between optical processors based on optical circuits in which the information carriers are photons and electronic processors based on electronic circuits in which the information carriers are electrons. In optical circuits the photon carriers do not interact with one another, while in electronic circuits the electron carriers do interact with one another. This fact means that in optical circuits interconnect possibilities exist that do not exist with electronic circuits. In particular, optical circuits allow parallel architectures which perform arithmetic and logical operations in completely parallel, single step processes. Since the speed of optical devices is essentially limited to the time it takes for a photon to transit a device, no faster computation time is possible.

The capability to detect overflow is a fundamental requirement of any general purpose computer whether the computer is optical or electronic. A slow overflow detection system slows the speed of the entire computational process. Thus, in order to provide an efficient optical processor based on RNS arithmetic, it is desirable for an RNS overflow detection capability to be developed which does not rely on explicit sign and magnitude information.

U.S. Pat. No. 4,121,298 entitled "Central Processing Unit For Numbers Represented in the System of Residual Classes," issued to Akushsky et al, discloses a RNS computer which detects overflow via a position attribute, or core function Use of the core function has the disadvantage that the core function is not necessarily monotonically increasing and therefore can produce somewhat ambiguous magnitude results. The invention disclosed in the '298 patent also requires time consuming feedback and iteration. In addition, a time consuming sequential division algorithm is employed in the 298 patent. Since the sequential division algorithm does not have a fixed length, the '298 system can not be used in conjunction with a pipelined system. The '298 patent is not designed to be used in conjunction with optical circuitry. Thus, the '298 device is not suitable for use for overflow detection in a high speed optical computer.

U.S. Pat. No. 4,064,400 entitled "Device For Multiplying Numbers in a System of Residual Classes," issued to Akushsky et al discloses a fully electronic RNS multiplier which detects overflow resulting from multiplication. The device disclosed in the '400 patent operates internally in binary. The multiplier is converted from its RNS representation to a binary fraction and an order of magnitude indicator is used for overflow detection. The binary fraction bits are used serially to perform Russian Multiplication Theorem operations on the multiplicand using RNS arithmetic. The serial use of the binary fraction bits in the '400 patent is time consuming In addition, the magnitude indicator used in the '400 patent has disadvantages similar to those described above with respect to core function used in the '298 patent. The electronic circuits employed by the device disclosed in the '400 patent are slower than optical circuits. Thus, the device disclosed in the '400 patent could not be used in an optical computer without significantly decreasing the overall speed of an optical computer.

Accordingly, there is a need for a high speed RNS addition overflow detection processor which can be effectively used in an optical computer.

SUMMARY OF THE INVENTION

It is an object of the invention, therefore, to provide a high speed RNS addition overflow detection processor.

Another object of the invention is to provide a RNS addition overflow detection processor which uses optical technologies to realize an efficient detection processor and which can be efficiently used in conjunction with other optical processing elements.

Another object of the invention is to provide a RNS addition overflow detection processor which processes inputs in a pipelined fashion.

A further object of the invention is to provide a RNS addition overflow detection processor which unambiguously detects overflow According to one aspect of the invention there is provided a residue addition overflow detection processor which adds a first non-redundant residue input number and a second non-redundant residue input number. The overflow detection processor includes a first base extension circuit which receives the first non-redundant residue input number and which generates a first redundant residue digit, and a second base extension circuit, in parallel to the first base extension circuit, which receives the second non-redundant residue input number and which generates a second redundant residue digit.

A first adder receives the first non-redundant residue input number and the first redundant residue digit as a first operand, and receives the second non-redundant residue input number and the second redundant residue digit as a second operand. The first adder adds the first operand to the second operand using modular addition to produce a first sum in residue representation.

A residue to mixed base converter receives the first sum, converts the first sum into mixed base representation, and generates at least one mixed base digit corresponding to the mixed base representation. A validity determination circuit then receives the mixed base digit and transmits a validity signal indicating whether overflow has occurred in the addition of the first non-redundant residue input number to the second non-redundant residue input number.

According to another aspect of the invention the residue addition overflow detection processor may also include first, second, and third delay circuits. The first delay circuit, arranged in parallel to the first base extension circuit, delays transmission of the first non-redundant residue input number to the first adder. The second delay circuit, arranged in parallel to the second base extension circuit, delays transmission of the second non-redundant residue input number to the first adder. The third delay circuit, arranged in parallel to the residue to mixed base converter, delays transmission of the first sum such that the first sum is delivered from the overflow detection processor essentially simultaneously with a delivery of the validity signal.

BRIEF DESCRIPTION OF THE DRAWINGS

The invention is described below with reference to the accompanying drawings, wherein:

FIG. 1 is a table illustrating decimal, residue, and mixed base representations of the decimal numbers 0 through 29;

FIG. 4, is a table illustrating decimal, residue, and mixed base representations of the decimal numbers −15 to 14;

FIG. 6 is a table illustrating decimal, residue, and mixed base representations of the decimal numbers −15 to 14 in which the third mixed base digit indicates the sign of the number;

FIG. 7 is a table illustrating decimal, residue, and fixed base representations in a redundant RNS;

FIG. 8 is a table illustrating decimal, residue, and mixed base representations in a redundant RNS where the left-most non-redundant modulus is 2;

FIG. 9 is a table illustrating decimal, residue, and mixed base representations of another RNS;

FIG. 10 is a table illustrating decimal, residue, and mixed base representations of another RNS;

DETAILED DESCRIPTION OF THE PREFERRED EMBODIMENTS

Residue and Mixed Base Number Theory

Figures 2, 3:
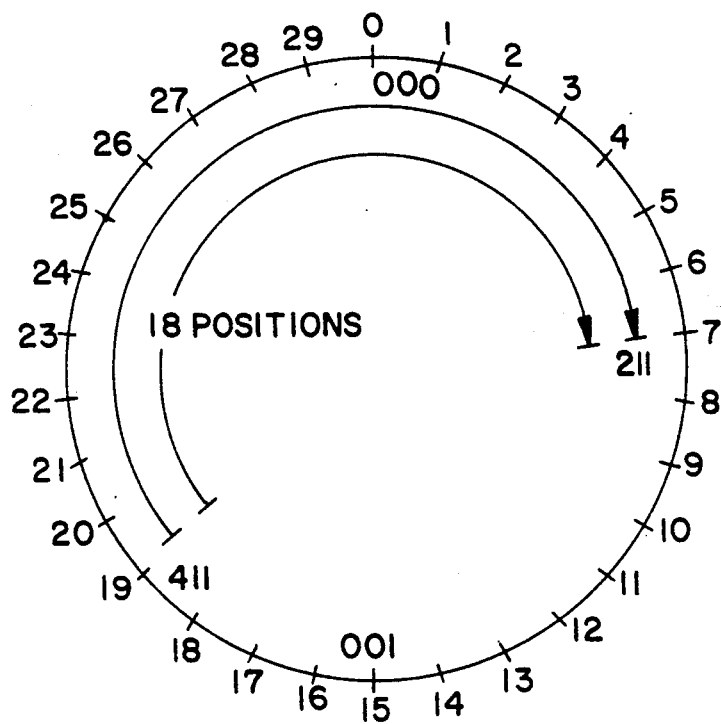
FIG. 2 illustrates an example of overflow occurring in RNS addition.
FIG. 3 illustrates the RNS ring associated with FIGS. 1 and 2.

An integer is represented in the RNS by writing down an n-tuple where the $i^{th}$ digit is the remainder, $r_i$, after division of the integer by an associated modulus, $m_i$. FIG. 1 lists RNS representations of the decimal numbers 0 to 29, when the moduli are 2, 3, and 5. For example, the decimal number 7 is represented as 211 in RNS representation. If the moduli are chosen to be mutually prime, then all integers within the range of zero to the product of the moduli minus one can be uniquely represented.

The importance of the residue number system to numerical processing is that the operations of addition, subtraction, and multiplication can be performed without the use of carry operations between the moduli. In other words, each digit in the n-tuple can be operated on independently and in parallel. For example, if n-tuples X, having digits $x_1 \ldots x_n$, and Y, having digits $y_1 \ldots y_p$, are added to produce Z, having digits $z_1 \ldots z_n$, then the $i^{th}$ digit is given by:

$$z_i = (X_i + y_i) \bmod m_i \qquad (1)$$

The mod function takes the number in front of "mod," in this case $x_i + y_i$, and divides this number by the number after "mod," in this case $m_i$, and substitutes the remainder for the entire function.

The power of RNS representation is that an operation on large numbers can be broken down into small parallel modular operations. For example, a sixteen bit binary number can be represented in a residue number system using the five moduli 5, 7, 11, 13 and 17. Multiplication of two 16 bit binary numbers produces a 32 bit intermediate result and requires 31 carry operations. In contrast, modular arithmetic devices can perform the same multiplication operation in one step per modulus, all steps being performed simultaneously in parallel.

The high speed potential of RNS arithmetic may be effectively exploited by optical computers that excel at parallel operations. Optical computers making use of RNS arithmetic promise at least an order of magnitude improvement in computational speed over standard electronic, binary computers.

A difficulty with the RNS representation is that magnitude comparisons can not be determined by a simple one-to-one digit comparison. For example, as seen from FIG. 1, in RNS representation the decimal number 16, which is represented in RNS representation as 110, appears smaller than the decimal number 8, which is represented in RNS representation as 320. Another difficulty associated with RNS representation is that the occurrence of overflow resulting from addition operations can not be readily detected. For u example, if decimal number 18, which is represented in RNS representation as 300, is added to decimal number 19, which is represented in RNS representation as 411, the RNS result would be 211, as is illustrated in FIG. 2. In the range 0–29, the RNS representation 211 corresponds to decimal number 7. There is no way to determine by inspection that overflow has occurred and that the correct sum is not 7. In order to implement a general purpose computer, overflow detection is required.

RNS representation and addition overflow can be illustrated by visualizing RNS representation as a ring such as depicted in FIG. 3. It is this periodic or ring property which complicates overflow detection in the RNS representation. If RNS representation is to be unambiguous in computation, a computational system must be implicitly restricted to a single range. There are only a finite number of positions in the RNS ring. In the example illustrated in FIG. 3, there are 30 finite positions. If each of these positions is occupied by one number within the range, the RNS forms a non-redundant ring. A redundant RNS has more positions on the ring than unique numbers to be represented. If two large numbers within the range are added, for example decimal 18 and decimal 19, the sum will be an overflow number which also corresponds to a number within the range, for example decimal number 7, represented in RNS as 211. A number within the predefined range is said to be "valid" while a number outside the predefined range is said to be "invalid". An analogous situation occurs in binary computers of fixed word length.

One method of obtaining overflow information involves mixed base representation. A number X may be expressed in mixed base form according to the following equations:

$$X = \sum_{j=1}^{N} a_j w_j \qquad (2)$$

where:

$$w_j = \prod_{i=1}^{j-1} m_i \quad j \geq 2 \qquad (3)$$

$$w_1 = 1 \quad j = 1$$

so that:

$$X = a_N \prod_{i=1}^{N-1} m_i + \ldots + a_3 m_1 m_2 + a_2 m_1 + a_1 \qquad (4)$$

The terms $w_1, \ldots, w_j$ are the bases and are related to the moduli of an associated RNS representation. The terms $a_1, \ldots, a_n$ are the mixed base digits. Any positive integer in the internal $$\left[ 0, \prod_{i=1}^{N-1} m_i - 1 \right]$$

may be represented in accordance with equation (4), and each integer has a unique representation. FIG. 1 lists the mixed base digits for decimal numbers 0 through 29. In FIG. 1, $w_1$ is 1, $w_2$ is the modulus 2, and $w_3$ is 6, the product of the modulus 2 and the modulus 3. Thus the decimal number 10 is represented as 120, where $a_1$ is 0, $a_2$ is 2, and $a_3$ is 1.

A mixed base system can be arranged such that:

$$a_j > m_j \qquad (5)$$

resulting in the property that:

$$|w_{k+1}| > \left| \sum_{j=1}^{k} a_j w_j \right| \qquad (6)$$

The arrangement of Equation (5) results in an ordered sequencing of the mixed base digits. As can be seen from Equation (6), this ordered sequencing allows direct magnitude determination by a comparison of the digits. For example, the mixed base number 220, decimal number 16, can be readily determined to be greater than the mixed base number 110, decimal number 8, since the most significant digit of 220 is greater than the most significant digit of 110.

Figure 5:
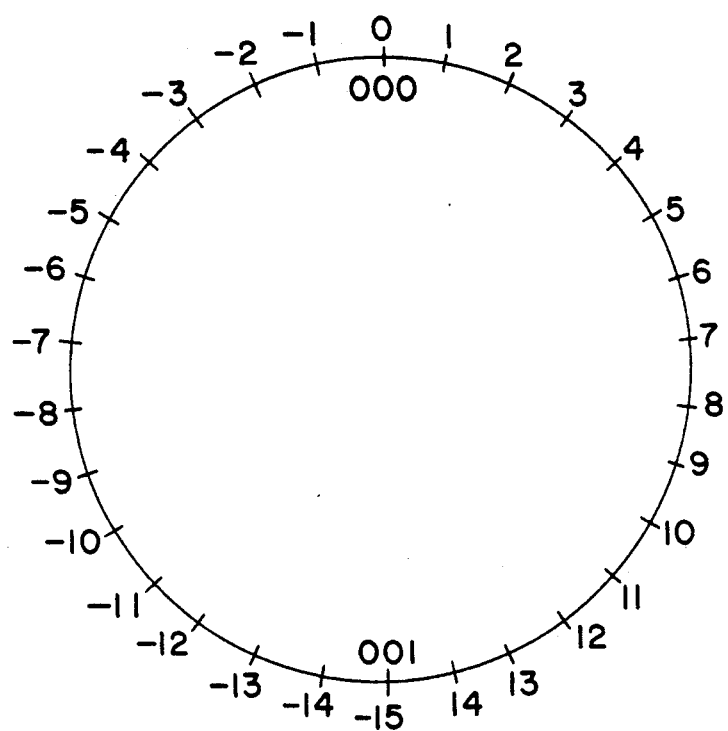
FIG. 5 illustrates the RNS ring associated with FIG. 4.

Negative numbers may also be implicitly represented in RNS representation. For example, FIG. 4 illustrates how the integers from −15 to 14 may be represented in RNS form. FIG. 5 illustrates the ring corresponding to FIG. 4.

Although RNS arithmetic involving negative numbers can be performed by forming a correspondence table between the negative numbers and associated positive numbers and performing intermediate computation using positive number RNS, it is frequently more useful to treat negative-and-positive-number RNS in a more direct fashion, as illustrated in FIG. 6. In FIG. 6 the order of the RNS digits is arranged such that the $m_3$ modulus is 2. The other moduli, 5 and 3, are arranged in descending order from left to right as $m_2$ and $m_1$ respectively. The mixed base weights for this new order is computed in accordance with equation (3) and mixed base digits $a_3$, $a_2$, and $a_1$ are tabulated in FIG. 6. FIG. 6 shows that $a_3$ can be used to determine whether an associated RNS number is positive or negative. That is, $a_3$ is zero for all non-negative numbers and 1 for all negative numbers. As will be described in further detail later, the invention makes use of both RNS and mixed base representations to detect overflow.

A non-redundant RNS can be made redundant by the use of an additional, redundant modulus $m_r$. An overflow detection processor which employs an additional modulus enlarges the ring to a size to which overflow could not occur, performs the addition, and determines whether or not the sum is within the valid range of the original non-redundant ring. In the alternative, the ring can be chosen to be redundant and the range of valid numbers could be limited to leave room for overflow detection.

An aspect of the invention makes use of the enlargement method. Several numerical examples will be discussed first in order to better understand the hardware descriptions below. A new modulus $m_r = 7$ is used in conjunction with $m_3 = 5$, $m_2 = 3$, and $m_1 = 2$. A new modulus of 7 is chosen because 7 is prime relative to the other moduli. Choosing a relative prime additional modulus ensures that mixed base digit computations and base extension, to be discussed further below, are possible FIG. 7 lists RNS representations using moduli of 2, 3, 5 and 7.

The new redundant RNS, in the illustrative example, has moduli of 7, 5, 3, and 2 and a ring circumference $M_r$ of the product of 2, 3, 5 and 7, or 210. Representations are valid in the range 0 to 29 inclusive and invalid in the range 30 to 209 inclusive. Validity can be determined by converting a number from RNS representation into mixed base representation and examining the fourth mixed base digit $a_r$. This fourth mixed base digit $a_r$ is zero for valid numbers and non-zero for invalid numbers. The use of the $a_r$ digit as a validity indicator, and thus an overflow indicator, can be understood from an examination of equation (3). Since the base $w_4$ associated with the redundant or fourth digit $a_r$ is the product of $m_1$, $m_2$, and $m_3$, the base $w_4$ is equal to 2·3·5, or 30. Therefore, a, will have a non-zero number when the number to be represented is in the invalid range greater than 29. The addition of one or more moduli to a RNS is also called extension of the base.

In general, it is sufficient to make the redundant ring merely twice as long as the original non-redundant ring if only non-negative numbers are to be represented. This statement is true because the largest sum possible S is $2(M-1)$, where M is the product of the original moduli. Assuming 2 is not already one of the moduli, if $m_4$ is 2, then the valid range of the redundant ring is $2M-1$, which is greater than $2(M-1)$. If 2 is already one of the moduli, then the next choice is $m_r=3$, and so on. Since the weight $w_4$ associated with the redundant digit $a_4$ does not depend on $m_4$, but rather only on $m_1$, $m_2$, and $m_3$, overflow is indicated when $a_4$ (or more generally $a_r$) is greater than zero regardless of the $m_4$ (or more generally $m_r$) chosen.

Although a number represented in a negative-and-positive number RNS can be determined to be positive or negative by inspection of the $a_3$ digit, as discussed above, the validity of an addition operation in such a negative-and-positive number RNS can not be determined by inspection of the $a_3$ digit. For example, assume a non-redundant RNS with moduli of $m_3=2$, $m_2=5$, and $m_1=3$ as illustrated in FIG. 6. If decimal number 10, represented in RNS representation as 001, is modularly added to decimal number 9, represented in RNS representation as 140, the modular addition sum would be 141. The RNS number 141 corresponds to a decimal number $-11$ which is not the correct sum of decimal number 10 and decimal number 9.

The use of a redundant ring solves the problem of determining whether the result of a negative-and-positive number RNS addition is valid. A redundant ring is formed by choosing a redundant modulus which is relatively prime with respect to the original non-redundant moduli. The Szabo and Tanaka text cited above proves, that if the left-most modulus $m_3$ is 2, then a redundant modulus $m_r$ of 3 is sufficient. However, since 3 is already one of the moduli, and 5 is one of the moduli, a redundant modulus $m_r$ of 7 is chosen. Hence, the moduli are $m_r=7$, $m_3=2$, $m_2=5$, and $m_1=3$. FIG. 8 lists RNS representations using these moduli. Using the example cited above, if decimal number 10, represented in redundant RNS as 3001, is added to decimal number 9, represented in redundant RNS as 2140, the modular addition sum is 5141. If 5141 is converted into mixed base form, the redundant mixed base digit $a_r$ is 1, indicating that the modular sum of 5141 is invalid.

In general, as shown in the Szabo and Tanaka text, the only valid numbers are those for which $a_3$ and $a_r$ are both zero or both maximum. In other words, if $a_3=0$ and $a_r=0$ then the modular sum is positive and valid. If $a_3$ is 1 and $a_r$ is $m_r-1$ then the modular sum is negative and valid.

The general form of the mixed base expansion resulting from the use of a redundant modulus is:

$$X = a_r \prod_{i=1}^{N} m_i + a_N \prod_{i=1}^{N-1} m_i + \ldots a_2 m_1 + a_1 \quad (7)$$

In the above example N was equal to 3 for illustrative purposes. Two techniques of recognizing the $a_3=0$ and $a_r=0$ coincidence and the $a_3=1$ and $a_r=m_r-1$ coincidence are available. In Technique 1 a device recognizes these coincidences and forms their logical OR. In Technique 2, the fact that because $m_N=2$, $(a_N+a_r)$ mod $m_r$ is zero for valid numbers and is non-zero for invalid numbers is employed.

A third technique, Technique 3, uses a redundant ring right from the start, in other words, uses redundant inputs. In Technique 3, mixed base computation of $a_N$ and $a_r$ is required. However, base extension hardware is not needed. Technique 3 requires an additional parallel arithmetic/logic unit (ALU) channel throughout the overflow detection processor. This additional channel can also be used for channel failure tests. However if the channels have sufficient reliability, a redundant RNS is employed without the addition of an extra channel, by not employing the choice of $m_N=2$, but by instead using a former $m_r$ for $m_N$. The following example will illustrate the theory of this aspect of Technique 3.

Assume the moduli are $m_3=7$, $m_2=5$, and $m_1=3$, as illustrated in FIG. 9. The ring circumference, or $M_r$, is the product of 7, 5, and 3, or 105. Numbers are valid from $-15$ to 14 inclusive. The ring associated with this system is 5/7 redundant. If a modular addition sum results in $a_3$ being zero the sum is valid positive, if the sum results in $a_3$ being $m_r-1$ or 6 the sum is valid negative, if the sum results in $a_3$ being 1, 2, 3, 4, or 5, overflow has occurred. This redundant ring can be made more efficient by using the same moduli but by redesignating them as $m_3=3$, $m_2=5$, and $m_1=7$, as illustrated in FIG. 10. This ring would be valid from $-35$ to 34 inclusive, thus resulting in a ring only $\frac{1}{3}$ redundant by reason of the larger valid range. For this less-redundant ring the most positive sum of two numbers would be $34+34$ or 68. The most negative sum of two numbers would be $(-35)+(-35)$ or $-70$. The most significant mixed base digit $a_3$ would be 0 for all valid positive numbers, 2 for all valid negative numbers, and 1 for all invalid numbers. This example illustrates that $m_N$ equal to 3 is sufficient to detect both algebraic sign and additive overflow. Choosing $m_N$ equal to 3 is sufficient to detect both the algebraic sign and additive overflow for all other moduli. The proof of this general assertion will not be repeated here.

These examples demonstrate that when $m_N>2$ in a redundant RNS where the valid numbers are in the range from $-M_r/m_N$, inclusive, to $(M_r/m_N)-1$, inclusive, examination of both $a_N$ and $a_r$ to detect overflow is not required. Examination of both $a_N$ and $a_r$ is not required because the use of $m_N$ performs all the tasks required of $m_N$ and $m_r$ in an RNS in which valid numbers are in the range from $-M_r/m_r m_N$, inclusive, to $+M_r/m_r m_N$, exclusive, or equivalently $-M/m_N$, inclusive, to $+M/m_N$, exclusive.

Processor Hardware

Figure 11:
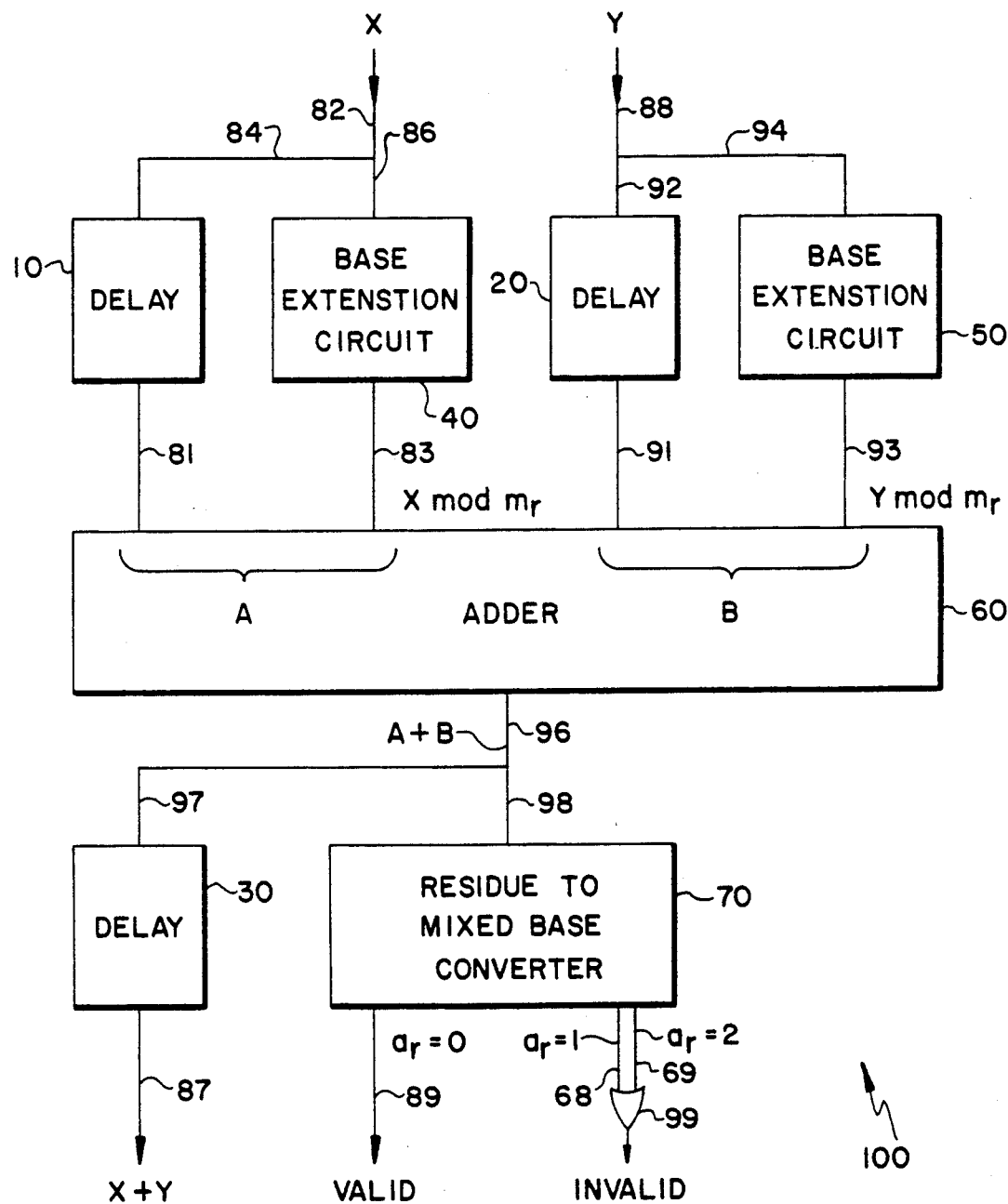
FIG. 11 is a block diagram of a first preferred embodiment of the invention.

FIG. 11 illustrates a residue addition overflow detection processor 100 according to a first preferred embodiment of the invention. The overflow detection processor 100 receives a number X in RNS representation and a number Y in RNS representation and generates the sum $X+Y$ in RNS representation. In the first preferred embodiment, input numbers X and Y are represented in positive non-redundant form. The overflow detection processor 100 also generates a VALID signal and an INVALID signal which indicates whether the sum $X+Y$ is valid (overflow has not occurred) or invalid (overflow has occurred). Simultaneous generation of both a VALID signal and a complementary INVALID signal is important in an optical system to maintain the positional one-of-m format since systems downstream of the overflow detection processor require an active input even when the addition results in overflow.

The overflow detection processor 100 may be used in conjunction with other optical processing systems, such as those disclosed in U.S. Pat. No. 4,797,843 issued Jan. 10, 1989, entitled "Parallel Optical Arithmetic/Logic Unit;" and in co-pending applications Ser. No. 07/019,761, filed Feb. 27, 1987, entitled "Optical Cross Bar Arithmetic/Logic Unit;" Ser. No 07/219,392, filed July 15, 1988, issued as U.S. Pat. No. 4,948,959 and entitled "Optical Computer Including Pipelined Conversion of Numbers to Residue Representation;" and Ser. No. 07/233,610, filed Aug. 18, 1988, issued as U.S. Pat. No. 4,910,699 and entitled "Optical Computer Including Parallel Residue to Binary Conversion;" all incorporated herein by reference.

Input numbers X and Y are received via signal lines 82 and 88. Since RNS representation is a positional representation requiring K individual signal lines to represent an RNS digit corresponding to a modulus of K, signal lines 82 and 88 are made up of numerous individual signal lines. Signal line 82 supplies signal line 84, which transmits X to delay circuit 10. Signal line 82 also supplies signal line 86, which transmits X to base extension circuit 40. In a similar fashion, signal line 88 supplies signal lines 92 and 94 which in turn supply Y to delay circuit 20 and base extension circuit 50, respectively.

Base extension circuit 40 receives X, calculates a redundant RNS digit $X \bmod m_r$, where $m_r$ is a redundant modulus as described above, and transmits the redundant RNS digit on signal line 83. Base extension circuit 40 performs the computation of a redundant RNS digit in a pipelined fashion using adder configured or multiplier configured optical arithmetic logic units. Suitable optical arithmetic logic units are described in detail in U.S. Pat. No. 4,797,843 patent and co-pending application Ser. No. 07/019,761 cited above. Co-pending application Ser. No. 07/414,019, entitled "Pipelined Residue to Mixed Base Converter and Base Extension Processor," by T. L. Houk and R. A. Falk, filed Sept. 29, 1989 and incorporated herein by reference, describes in detail the construction and operation of a base extension circuit. Base extension circuit 50 computes a redundant RNS digit $Y \bmod m_r$ in a similar fashion and transmits this redundant digit on signal line 93. Redundant digits $X \bmod m_r$ and $Y \bmod m_r$ are supplied to a residue adder 60 via signal lines 83 and 93 respectively.

Since the base extension processing takes a finite period of time to accomplish, the non-redundant digits must be delayed in order to preserve the synchronism of data passing through the overflow detection processor 100. This delay is accomplished by delaying the non-redundant RNS digits supplied via signal lines 84 and 92 in delay circuits 10 and 20, respectively. Delay circuits 10 and 20 can be an adder configured optical arithmetic logic unit such as described above in which one operand is zero, or a multiplier configured optical arithmetic logic unit such as described above in which one operand is one. The provision of delay circuits is important for maintaining synchronism in the pipelined operation of the processor. The delayed non-redundant RNS digits are transmitted via signal lines 81 and 91 to adder 60.

The adder 60 receives the non-redundant X RNS digits via signal line 81 and the redundant X RNS digit via signal line 83 and adds these X digits to the Y digits in the form of non-redundant Y RNS digits received via signal line 91 and redundant RNS Y digit received via signal line 93. This modular addition is similar to that described with respect to FIG. 2.

Figure 12:
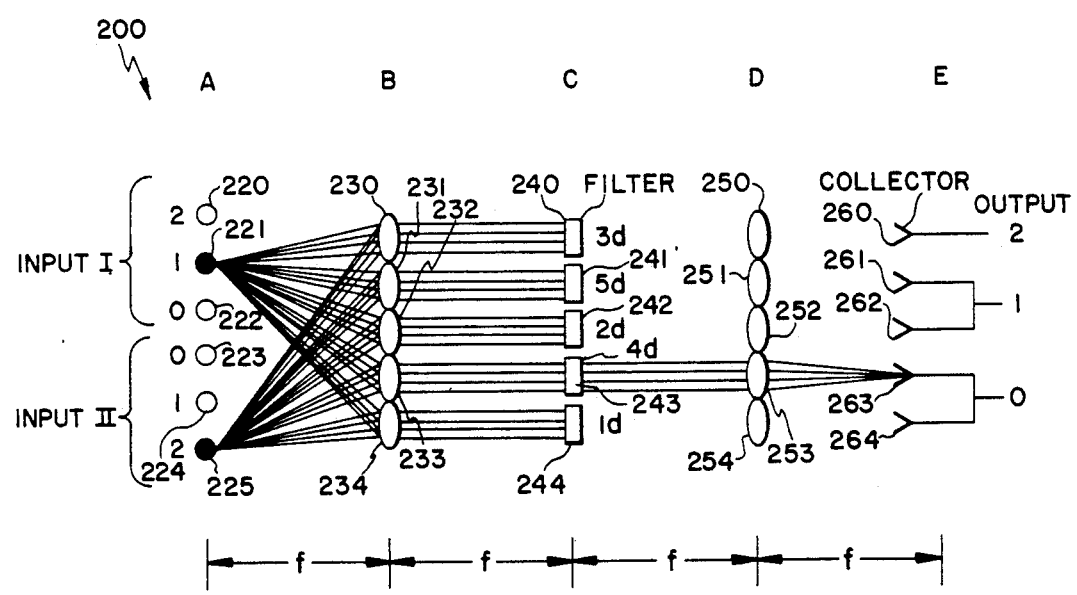
FIG. 12 illustrates a design of the adder of FIG. 11.

The parallel optical arithmetic logic unit described in U.S. Pat. No. 4,797,843 cited above can be used as the adder 60. A parallel optical arithmetic logic unit adder 200 for a modulus of 3 is illustrated in FIG. 12. In FIG. 12, inputs from point-light sources 220, 221, 222, 223, 224 and/or 225 form a spatial pattern corresponding to a given separation of point sources. Lenses 230, 231, 232, 233, and 234 produce Fourier transforms of the source configuration. Filters 240, 241, 242, 243 and 244 allow light energy to pass when the light energy results from a specific spatial pattern. The output of each filter passes through lens 250, 251, 252, 253, or 254 and is detected by collector 260, 261, 262, 263 or 264. The pattern of the point-light sources and the detection values of the filters accomplish the addition process. As the unit illustrated in FIG. 12 only adds one X digit to one Y digit, the adder 60 would typically include several units similar to the unit illustrated in FIG. 12 arranged in parallel Alternatively, the optical cross bar arithmetic logic units disclosed in the co-pending application Ser. No. 07/019,761 or any other form of optical RNS adder may be used as adder 60.

Figure 13:
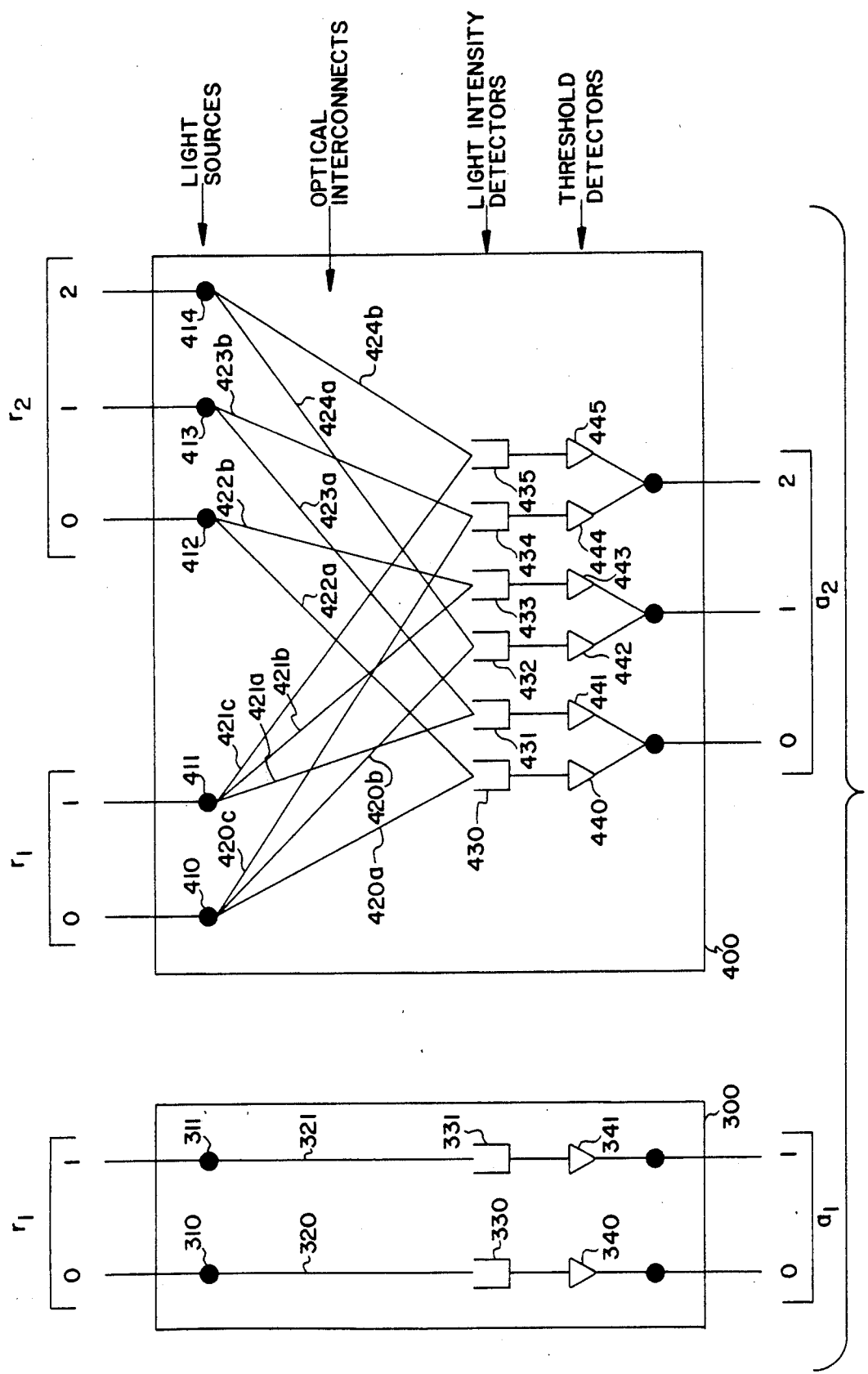
FIG. 13 illustrates a design of the residue to mixed base converter of FIG. 11.

The output of adder 60 is transmitted to a delay circuit 30, via signal lines 96 and 97, and to a residue to mixed base converter 70, via signal lines 96 and 98. The residue to mixed base converter 70 converts the sum computed by the adder 60 into mixed base representation. An $a_r = 0$ terminal from the residue to mixed base converter 70 is connected to signal line 89. When $a_r$ is zero, the addition of X and Y has not resulted in overflow, and therefore the $a_r = 0$ signal is used as the VALID signal. Terminals associated with any non-zero values of $a_r$, for example $a_r = 1$ and $a_r = 2$, are connected via signal lines, for example signal lines 68 and 69, to an OR gate 99. Thus whenever $a_r$ is not equal to zero an INVALID signal will be transmitted from OR gate 99. FIG. 11 illustrates OR gate 99 receiving an $a_r = 1$ signal and an $a_r = 2$ signal, however it is understood that, depending on the moduli chosen, $a_r$ may assume non-zero values other than 1 and 2. All non-zero $a_r$ signals are OR'ed together to generate the INVALID signal A suitable design for the residue to mixed base converter 70 is illustrated in FIG. 13 and is described in further detail in co-pending Ser. No. 07/41,474 entitled "Parallel Residue To Mixed Base Converter," by R. A. Falk, filed Sept. 29, 1989 and incorporated herein by reference. In FIG. 13, a first digit converter 300 is arranged in parallel with a second digit converter 400. The first digit converter 300 converts the RNS digit $r_1$ into mixed base digit $a_1$. The second digit converter 400 converts the RNS digits $r_1$ and $r_2$ into mixed base digit $a_2$. The proper conversion is accomplished by arranging light sources 310-311 and 410-414, optical interconnects 320-321 and 420-424, light intensity detectors 330-331 and 430-435, and threshold detectors 340-341 and 440-445 in a specific pattern. Input signals for $r_1$ and $r_2$ activate light sources associated with the values of $r_1$ and $r_2$. The activated light sources transmit light along optical interconnects to activate threshold detectors indicative of the value of the mixed base digit associated with that digit converter.

The output of the adder 60 transmitted by signal line 97 is delayed by delay-circuit 30 in order to ensure that the sum $X + Y$ transmitted by the overflow detection processor 100 coincides with the correct VALID and INVALID signals. The output of delay circuit 30 is transmitted via signal line 87 as the sum of X and Y.

The signal lines in the overflow detection processor 100 described above transmit optic signals. However, it is understood that these signal lines may transmit electric signals if required to meet a user's particular application.

If the general purpose base extension system described in the co-pending application entitled "Pipelined Residue To Mixed Base Converter and Base Extension Processor," cited above, is used as the base extension circuits 40 and 50, the base extension process requires N steps for N non-redundant moduli. The addition performed by adder 60 requires one step. The residue to mixed base converter system described in FIG. 13 and in the co-pending application entitled "Parallel Residue to Mixed Base Converter," cited above, requires one step. Thus overflow testing as described above would require only N+1 additional steps.

If the overflow detection processor 100 is to be used when X and Y are large numbers having large moduli, the residue to mixed base converter described in the co-pending application entitled "Parallel Residue To Mixed Base Converter" may not be desirable due to the amount of hardware that would be required. In this case, the residue to mixed base converter described in the co-pending application entitled "Pipelined Residue To Mixed Base Converter and Base Extension Processor" can be used. The converter described in the co-pending application entitled "Pipelined Residue To Mixed Base Converter and Base Extension Processor" requires N steps for converting the sum, therefore the total number of steps added for overflow testing using this converter is 2N.

Figure 14:
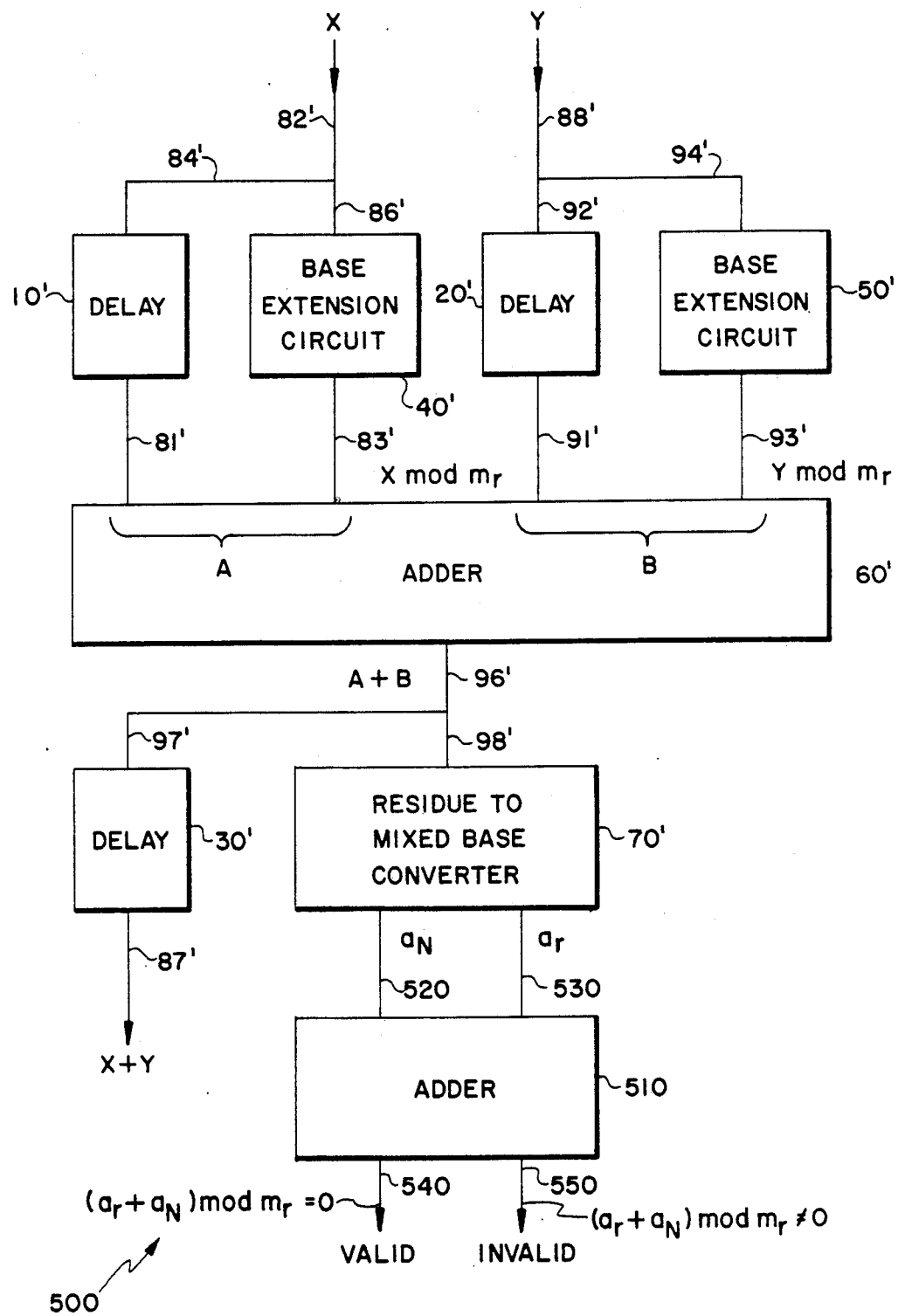
FIG. 14 is a block diagram of a second preferred embodiment of the invention.

The first preferred embodiment described above is employed where input numbers X and Y are represented in positive non-redundant representation such as illustrated in FIG. 1. FIG. 14 illustrates a second preferred embodiment of an overflow detection processor 500 which is used when input numbers X and Y are in negative-and-positive non-redundant representation such as illustrated in FIG. 6. In the second preferred embodiment $m_N$ is equal to 2 in order to indicate the sign of a number, as described above. In FIG. 14, non-redundant negative-and-positive input numbers X and Y are received via signal lines 82' and 88'. The sum of X and Y is transmitted via signal line 87', and VALID and INVALID signals are transmitted via signal lines 540 and 550, respectively. Components illustrated in the second preferred embodiment of FIG. 14 which are constructed and operated similarly to corresponding components in the first preferred embodiment of FIG. 11 are designated by primed numbers. A description of the primed components will not be repeated here.

Figure 15:
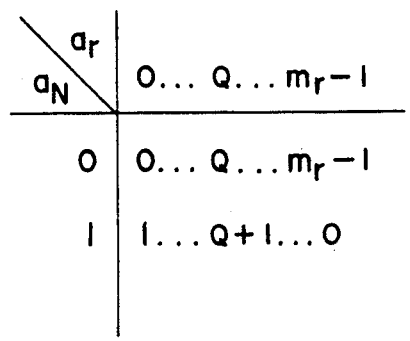
FIG. 15 is a truth table for explaining the validity signal generation of FIG. 14.

The second preferred embodiment is constructed and operates in a fashion similar to the first preferred embodiment except for the technique of generating the VALID and INVALID signals subsequent to residue to mixed base conversion. In the first preferred embodiment the $a_r$ signals of the residue to mixed base converter 70 are used to generate the VALID and INVALID signals In the second preferred embodiment, both the $a_r$ signals and $a_N$ signals are used in accordance with Technique 2 described above. The $a_r$ signals from the residue to mixed base converter 70' are provided to a modular adder 510 via signal line 530 and $a_N$ signals from the converter 70' are provided to modular adder 510 via signal line 520. The adder 510 adds $a_r$ and $a_N$ using modulo $m_r$ addition. The adder 510 can be constructed using any of the adders described above with respect to the adder 60. After addition, the adder 510 transmits a VALID signal if $(a_r+a_N)\mod m_r$ is equal to zero, and an INVALID signal if $(a_r+a_N)\mod m_r$ is not equal to zero. The addition performed by the adder 510 requires one step. FIG. 15 is a truth table which lists the sum of $a_r$ and $a_N$ when $m_N$ is 2 and $m_r$ is arbitrary. In FIG. 15, Q is any value of $a_r$ except 0 or $m_r-1$. In general $(a_r)_{max}=m_r-1$.

Figure 16:
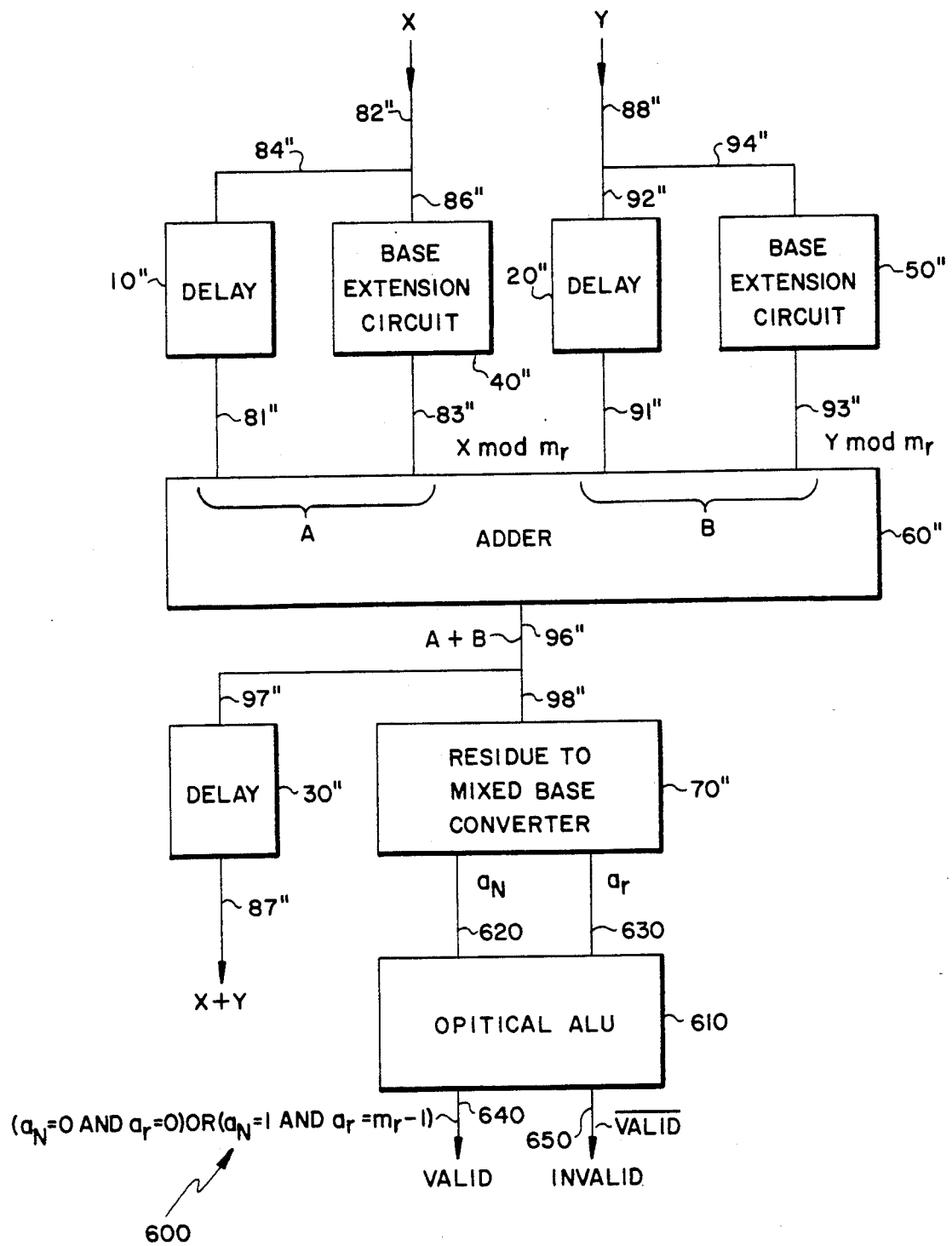
FIG. 16 is a block diagram of a third preferred embodiment of the invention.

FIG. 16 illustrates a third preferred embodiment of an overflow detection processor 600 which uses Technique 1 described above. The third preferred embodiment of FIG. 16 is identical to the second preferred embodiment of FIG. 14 except that the functions performed by the adder 510 of the second preferred embodiment are performed by an optical arithmetic and logic unit (ALU) 610 in the third preferred embodiment. Components illustrated in the FIG. 16 third preferred embodiment which are constructed and operated similarly to corresponding components in the first preferred embodiment of FIG. 11 are designated by double primed numbers. A description of the double primed components will not be repeated here.

In the third preferred embodiment, the value of $a_r$ is transmitted to optical ALU 610 via signal line 630 and the value of $a_N$ is transmitted to optical ALU 610 via signal line 620. Optical ALU 610 computes the VALID and INVALID signals according to the following logical equations:

$$\text{VALID} = (a_N = 0 \text{ AND } a_r = 0) \text{ OR} \qquad (8)$$
$$(a_N = 1 \text{ AND } a_r = m_r - 1)$$

$$\text{INVALID} = \overline{\text{VALID}} \qquad (9)$$

The optical ALU 610 produces both a VALID signal and its complementary INVALID signal to maintain the positional one-of-m format characteristic of optical ALU systems. Without this complementary signal an optical ALU downstream of the overflow detection processor would not produce an output signal. The overflow detection processor 600 can use optical arithmetic and logic units disclosed in U.S. Pat. No. 4,797,843 and co-pending application Ser. No. 07/019,761, cited above, as optical ALU 610.

Figure 17:
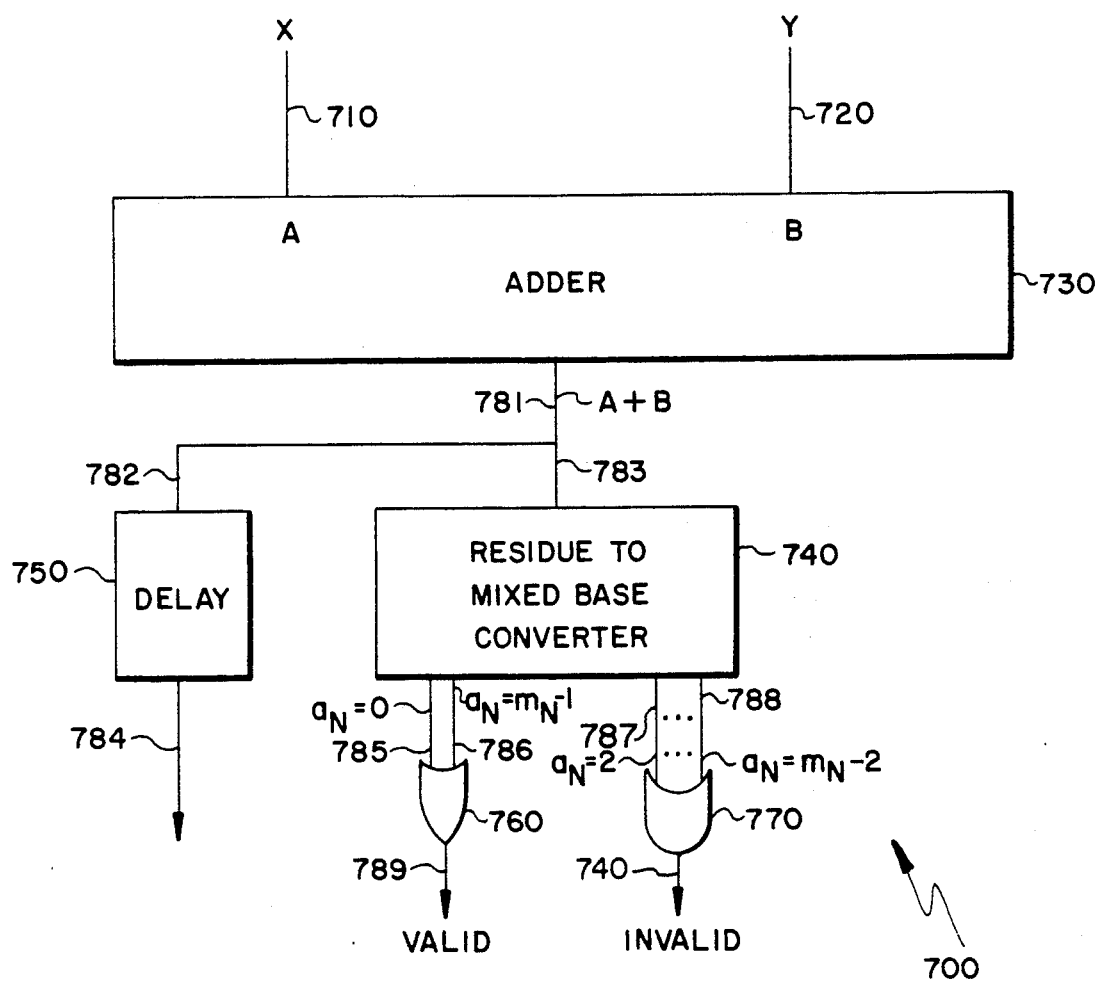
FIG. 17 is a block diagram of a fourth preferred embodiment of the invention.

FIG. 17 illustrates a fourth preferred embodiment of an overflow detection processor 700 which uses Technique 3 described above. In the fourth preferred embodiment, inputs X and Y are in redundant representation and $m_N$ is greater than 2. In FIG. 17, redundant inputs X and Y are transmitted to an adder 730 via signal lines 710 and 720. Adder 730 modularly adds X and Y and transmits the sum to residue to mixed base converter 740 and delay circuit 750 via signal lines 781 and 783, and 781 and 782, respectively. Adder 730, residue to mixed base converter 740, and delay circuit 750 can be constructed as described above with respect to the first preferred embodiment. The $a_N=0$ and $a_N=m_N-1$ signals of the residue to mixed base converter 740 are transmitted to OR gate 760 via signal lines 785 and 786. The OR gate 760 logically OR's the $a_N=0$ and $a_N=m_N-1$ signals to generate a VALID signal on signal line 789.

Signals corresponding to values of $a_N$ which are not 0 or $m_N-1$ are transmitted to an OR gate 770 via signal lines, for example signal lines 787 and 788. The OR gate 770 logically OR's the inputs to OR gate 770 to produce the INVALID signal on signal line 790.

Figure 18:
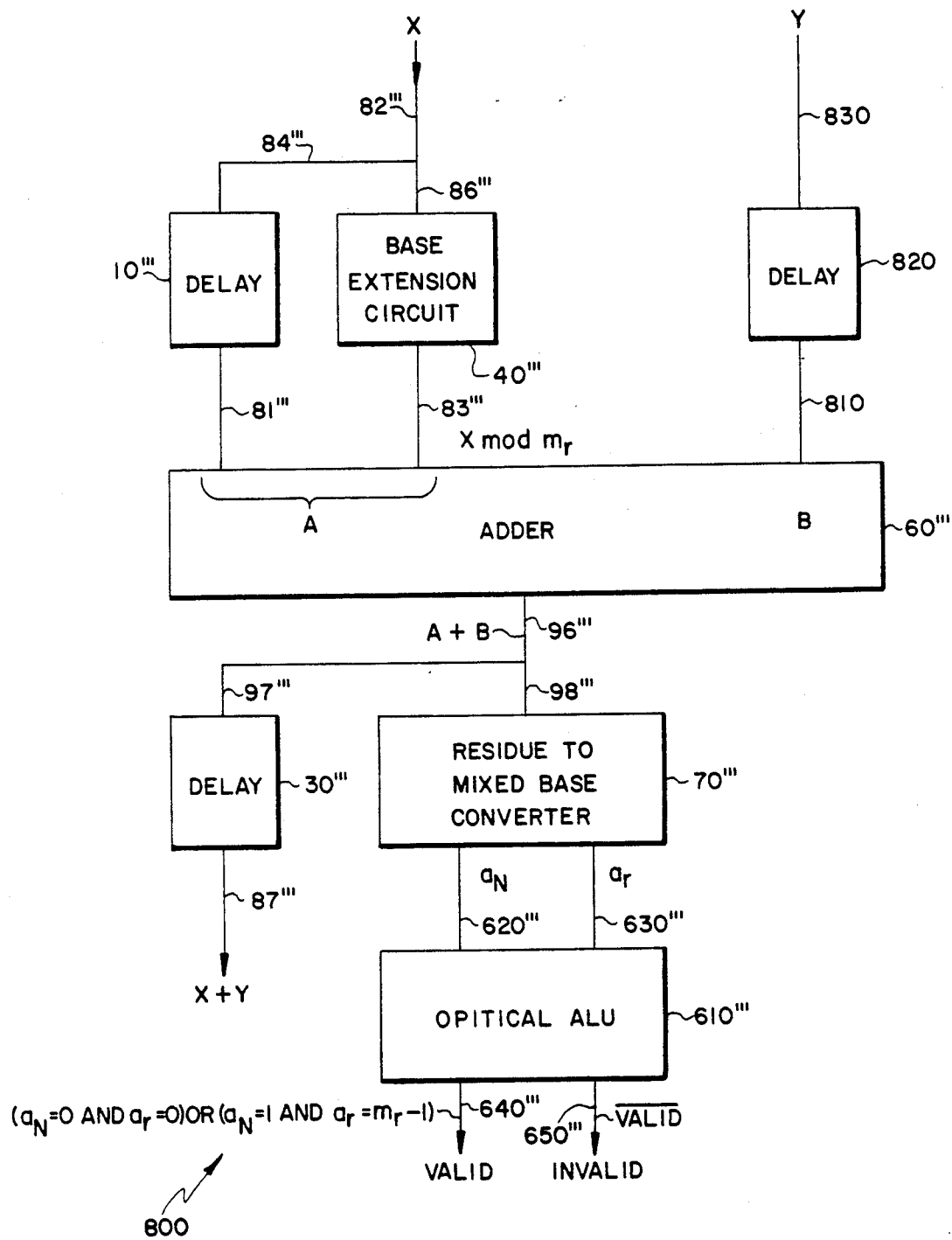
FIG. 18 is a block diagram of a fifth preferred embodiment of the invention.

FIG. 18 illustrates a fifth preferred embodiment of an overflow detection processor 800. The processor 800 receives a non-redundant number X on signal line 82''' and a redundant number Y on signal line 830. In this embodiment, the received redundant number Y has one more digit than received non-redundant number X. A delay circuit 820 is provided in the redundant signal path to maintain synchronism. The remaining components of processor 800 operate similarly to the corresponding components of FIG. 16.

The foregoing description has been set forth merely to illustrate preferred embodiments of the invention and is not intended to be limiting. Since modification of the described embodiments incorporating the spirit and substance of the invention may occur to persons skilled in the art, the scope of the invention should be limited solely with respect to the appended claims and equivalents.

What is claimed is:

1. A residue addition overflow detection processor which adds a first non-redundant residue input number and a second non-redundant residue input number, said overflow detection processor comprising:

a first base extension circuit which receives said first non-redundant residue input number and which generates a first redundant residue digit;

a second base extension circuit, in parallel to said first base extension circuit, which receives said second non-redundant residue input number and which generates a second redundant residue digit;

a first adder which receives said first non-redundant residue input number and said first redundant residue digit as a first operand, and receives said second non-redundant residue input number and said second redundant residue digit as a second operand, said first adder adding said first operand to said second operand using modular addition to produce a first sum in residue representation;

a residue to mixed base converter which receives said first sum, converts said first sum into mixed base representation, and generates at least one mixed base digit corresponding to said mixed base representation; and a validity determination circuit which receives said at least one mixed base digit and transmits at least one signal indicating whether overflow has occurred in addition of said first non-redundant residue input number to said second non-redundant residue input number.

2. A residue addition overflow detection processor as set forth in claim 1 above, further comprising:

a first delay circuit, arranged in parallel to said first base extension circuit, which delays a transmission of said first non-redundant residue input number to said first adder;

a second delay circuit, arranged in parallel to said second base extension circuit, which delays a transmission of said second non-redundant residue input number to said first adder; and a third delay circuit, arranged in parallel to said residue to mixed base converter, which delays a transmission of said first sum such that said first sum is transmitted from said overflow detection processor simultaneously with transmission of said at least one signal indicating whether overflow has occurred.

3. A residue addition overflow detection processor as set forth in claim 1 above, further comprising:

a first signal line transmitting an active validity signal when a redundant mixed base digit is equal to zero; and a second signal line transmitting an active invalidity signal when said redundant mixed base digit is not equal to zero.

4. A residue addition overflow detection processor as set forth in claim 1 above, further comprising:

a second adder which receives a redundant mixed base digit and a highest order non-redundant mixed base digit from said residue to mixed base converter, said second adder adding said redundant mixed base digit to said highest order non-redundant mixed base digit using modular addition to produce a second sum, said second adder transmitting an active validity signal when said second sum is equal to zero and transmitting an active invalidity signal when said second sum is not equal to zero.

5. A residue addition overflow detection processor as set forth in claim 1 above, further comprising:

an arithmetic and logic unit which receives a redundant mixed base digit and a highest order non-redundant mixed base digit from said residue to mixed base converter, said arithmetic and logic unit transmitting an active validity signal when both said redundant mixed base digit and said highest order non-redundant mixed base digit are equal to zero or when both said highest order non-redundant mixed base digit is equal to one and said redundant mixed base digit is equal to the value of a redundant modulus minus one.

6. A residue addition overflow detection processor as set forth in claim 1 above, wherein said first base extension circuit, said second base extension circuit, said first adder, and said residue to mixed base converter comprise optical circuits.

7. A residue addition overflow detection processor as set forth in claim 1 above, wherein said validity determination circuit simultaneously transmits a validity signal indicating whether overflow has occurred and an invalidity signal, said invalidity signal being a complement of said validity signal.

8. A residue addition overflow detection processor as set forth in claim 2 above, further comprising:

a first signal line transmitting an active validity signal when a redundant mixed base digit is equal to zero; and a second signal line transmitting an active invalidity signal when said redundant mixed base digit is not equal to zero.

9. A residue addition overflow detection processor as set forth in claim 2 above, further comprising:

a second adder which receives a redundant mixed base digit and a highest order non-redundant mixed base digit from said residue to mixed base converter, said second adder adding said redundant mixed base digit to said highest order non-redundant mixed base digit using modular addition to produce a second sum, said second adder transmitting an active validity signal when said second sum is equal to zero and transmitting an active invalidity signal when said second sum is not equal to zero.

10. A residue addition overflow detection processor as set forth in claim 2 above, further comprising:

an arithmetic and logic unit which receives a redundant mixed base digit and a highest order non-redundant mixed base digit from said residue to mixed base converter, said arithmetic and logic unit transmitting an active validity signal when both said redundant mixed base digit and said highest order non-redundant mixed base digit are equal to zero or when both said highest order non-redundant mixed base digit is equal to one and said redundant mixed base digit is equal to the value of a redundant modulus minus one.

11. A residue addition overflow detection processor as set forth in claim 6 above, wherein said validity determination circuit simultaneously transmits a validity signal indicating whether overflow has occurred and an invalidity signal, said invalidity signal being a complement of said validity signal.

12. A residue addition overflow detection processor which adds a first redundant residue input number and a second redundant residue input number, said overflow detection processor comprising:

an adder which receives said first redundant residue input number as a first operand and said second redundant residue input number as a second operand, said adder adding said first operand to said second operand using modular addition to produce a sum in residue representation;

a residue to mixed base converter which receives said sum, converts said sum into mixed base representation, and transmits a value of a mixed base digit corresponding to said mixed base representation;

a validity determination circuit which receives said value of said mixed base digit and transmits at least one signal, indicating that overflow has occurred in addition of said first redundant residue input number to said second redundant residue input number, when said value of said mixed base digit is either equal to zero or equal to the value of a highest order modulus minus one.

13. A residue addition overflow detection processor as set forth in claim 12, further comprising:

a delay circuit, arranged parallel to said residue to mixed base converter, which delays a transmission of said sum such that said sum is transmitted from said overflow detection processor essentially simultaneously with transmission of said at least one signal indicating whether overflow has occurred 14. A residue addition overflow detection processor as set forth in claim 12 above, wherein said validity determination circuit simultaneously transmits a validity signal indicating whether overflow has occurred and an invalidity signal, said invalidity signal being a complement of said validity signal.

15. A residue addition overflow detection processor as set forth in claim 12 above, wherein said adder, said residue to mixed base converter, and said validity determination circuit are optical circuits.

16. A residue addition overflow detection processor as set forth in claim 15 above, wherein said validity determination circuit simultaneously transmits a validity signal indicating whether overflow has occurred and an invalidity signal, said invalidity signal being a complement of said validity signal.

17. A method of detecting overflow resulting from adding a first non-redundant residue input number to a second non-redundant residue input number, comprising the steps of:

receiving said first non-redundant residue input number;

receiving said second non-redundant residue input number;

generating a first redundant residue digit corresponding to said first non-redundant residue input number;

delaying said first non-redundant residue input number to produce a delayed first non-redundant residue input number;

generating a second redundant residue digit corresponding to said second non-redundant residue input number;

delaying said second non-redundant residue input number to produce a delayed second non-redundant residue input number;

adding said delayed first non-redundant residue input number and said first redundant residue digit as a first operand to said delayed second non-redundant residue input number and said second redundant residue digit as a second operand to produce a sum;

converting said sum into mixed base representation in a form of at least one mixed base digit;

generating at least one signal based on at least one value of said at least one mixed base digit, said at least one signal indicating whether overflow resulted from addition of said first non-redundant residue input number to said second non-redundant residue input number; and delaying a transmission of said sum in order to transmit said sum simultaneously with transmission of said at least one signal.

18. A method of detecting overflow as set forth in claim 17, further comprising the step of:

simultaneously generating a validity signal indicating whether overflow has occurred and an invalidity signal, said invalidity signal being a complement of said validity signal.

19. A method of detecting overflow resulting from adding a first redundant residue input number to a second redundant residue input number, comprising the steps of:

receiving said first redundant residue input number;

receiving said second redundant residue input number;

adding said first redundant residue input number to said second redundant residue input number to produce a sum;

converting said sum into mixed base representation in a form of at least one mixed base digit;

generating at least one signal based on at least one value of said at least one mixed base digit, said at least one signal indicating whether overflow resulted from addition of said first redundant residue input number to said second redundant residue input number; and delaying a transmission of said sum in order to transmit said sum simultaneously with a transmission of said at least one signal.

20. A method of detecting overflow as set forth in claim 19, further comprising the step of:

simultaneously generating a validity signal indicating whether overflow has occurred and an invalidity signal, said invalidity signal being a complement of said validity signal.

21. A residue addition overflow detection processor which adds a first non-redundant residue input number and a second redundant residue input number, said overflow detection processor comprising:

a first base extension circuit which receives said first non-redundant residue input number and which generates a first redundant residue digit;

a first adder which receives said first non-redundant residue input number and said first redundant residue digit as a first operand, and receives said second redundant residue input number as a second operand, said first adder adding said first operand to said second operand using modular addition to produce a first sum in residue representation;

a residue to mixed base converter which receives said first sum, converts said first sum into mixed base representation, and generates at least one mixed base digit corresponding to said mixed base representation; and a validity determination circuit which receives said at least one mixed base digit and transmits at least one signal indicating whether overflow has occurred in addition of said first non-redundant residue input number to said second redundant residue input number.

22. A residue addition overflow detection processor as set forth in claim 21 above, further comprising:

a first delay circuit, arranged in parallel to said first base extension circuit, which delays a transmission of said first non-redundant residue input number to said first adder;

a second delay circuit which delays a transmission of said second redundant residue input number to said first adder; and a third delay circuit, arranged in parallel to said residue to mixed base converter, which delays a transmission of said first sum such that said first sum is transmitted from said overflow detection processor simultaneously with transmission of said at least one signal indicating whether overflow has occurred.

23. A residue addition overflow detection processor as set forth in claim 21 above, further comprising:

a first signal line transmitting an active validity signal when a redundant mixed base digit is equal to zero; and a second signal line transmitting an active invalidity signal when said redundant mixed base digit is not equal to zero.

24. A residue addition overflow detection processor as set forth in claim 21 above, further comprising:

a second adder which receives a redundant mixed base digit and a highest order non-redundant mixed base digit from said residue to mixed base converter, said second adder adding said redundant mixed base digit to said highest order non-redundant mixed base digit using modular addition to produce a second sum, said second adder transmitting an active validity signal when said second sum is equal to zero and transmitting an active invalidity signal when said second sum is not equal to zero.

25. A residue addition overflow detection processor as set forth in claim 21 above, further comprising:

an arithmetic and logic unit which receives a redundant mixed base digit and a highest order non-redundant mixed base digit from said residue to mixed base converter, said arithmetic and logic unit transmitting an active validity signal when both said redundant mixed base digit and said highest order non-redundant mixed base digit are equal to zero or when both said highest order non-redundant mixed base digit is equal to one and said redundant mixed base digit is equal to the value of a redundant modulus minus one.

26. A residue addition overflow detection processor as set forth in claim 21 above, wherein said first base extension circuit, said first adder, and said residue to mixed base converter comprise optical circuits.

27. A residue addition overflow detection processor as set forth in claim 21 above, wherein said validity determination circuit simultaneously transmits a validity signal indicating whether overflow has occurred and an invalidity signal, said invalidity signal being a complement of said validity signal.

28. A residue addition overflow detection processor as set forth in claim 22 above, further comprising:

a first signal line transmitting an active validity signal when a redundant mixed base digit is equal to zero; and a second signal line transmitting an active invalidity signal when said redundant mixed base digit is not equal to zero.

29. A residue addition overflow detection processor as set forth in claim 22 above, further comprising:

a second adder which receives a redundant mixed base digit and a highest order non-redundant mixed base digit from said residue to mixed base converter, said second adder adding said redundant mixed base digit to said highest order non-redundant mixed base digit using modular addition to produce a second sum, said second adder transmitting an active validity signal when said second sum is equal to zero and transmitting an active invalidity signal when said second sum is not equal to zero.

30. A residue addition overflow detection processor as set forth in claim 22 above, further comprising:

an arithmetic and logic unit which receives a redundant mixed base digit and a highest order non-redundant mixed base digit from said residue to mixed base converter, said arithmetic and logic unit transmitting an active validity signal when both said redundant mixed base digit and said highest order non-redundant mixed base digit are equal to zero or when both said highest order non-redundant mixed base digit is equal to one and said redundant mixed base digit is equal to the value of a redundant modulus minus one.

31. A residue addition overflow detection processor as set forth in claim 26 above, wherein said validity determination circuit simultaneously transmits a validity signal indicating whether overflow has occurred and an invalidity signal, said invalidity signal being a complement of said validity signal.

32. A method of detecting overflow resulting from adding a first non-redundant residue input number to a second redundant residue input number, comprising the steps of:

receiving said first non-redundant residue input number;

receiving said second redundant residue input number;

generating a first redundant residue digit corresponding to said first non-redundant residue input number;

delaying said first non-redundant residue input number to produce a delayed first non-redundant residue input number;

delaying said second redundant residue input member to produce a delayed second redundant residue input number;

adding said delayed first non-redundant residue input number and said first redundant residue digit as a first operand to said delayed second redundant residue input number as a second operand to produce a sum;

converting said sum into mixed base representation in a form of at least one mixed base digit;

generating at least one signal based on at least one value of said at least one mixed base digit, said at least one signal indicating whether overflow resulted from addition of said first non-redundant residue input number to said second redundant residue input number; and delaying a transmission of said sum in order to transmit said sum simultaneously with transmission of said at least one signal.

33. A method of detecting overflow as set forth in claim 32, further comprising the step of:

simultaneously generating a validity signal indicating whether overflow has occurred and an invalidity signal, said invalidity signal being a complement of said validity signal.

* * * * *